US012620971B2

(12) United States Patent
Kawauchi et al.

(10) Patent No.: US 12,620,971 B2
(45) Date of Patent: May 5, 2026

(54) VIBRATOR ELEMENT, VIBRATOR DEVICE, AND METHOD OF MANUFACTURING VIBRATOR ELEMENT

(71) Applicant: SEIKO EPSON CORPORATION, Tokyo (JP)

(72) Inventors: Osamu Kawauchi, Shiojiri (JP); Takuro Kobayashi, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 1004 days.

(21) Appl. No.: 17/832,971

(22) Filed: Jun. 6, 2022

(65) Prior Publication Data

US 2022/0407499 A1     Dec. 22, 2022

(30) Foreign Application Priority Data

Jun. 16, 2021     (JP) ................................. 2021-099985

(51) Int. Cl.
| | |
|---|---|
| *H03H 9/215* | (2006.01) |
| *H03H 3/02* | (2006.01) |
| *H03H 3/04* | (2006.01) |
| *H03H 9/10* | (2006.01) |

(52) U.S. Cl.
CPC .............. *H03H 9/215* (2013.01); *H03H 3/04* (2013.01); *H03H 9/1021* (2013.01); *H03H 2003/026* (2013.01); *H03H 2003/0442* (2013.01); *H03H 2003/0492* (2013.01)

(58) Field of Classification Search
CPC .... H03H 3/04; H03H 9/02157; H03H 9/0547; H03H 9/1021; H03H 9/215; H03H 2003/026; H03H 2003/0414; H03H 2003/0442; H03H 2003/0492
See application file for complete search history.

(56) References Cited

U.S. PATENT DOCUMENTS

| | | | | |
|---|---|---|---|---|
| 8,330,560 | B2 * | 12/2012 | Matsudo ................ | H03H 9/215 310/370 |
| 11,448,505 | B2 * | 9/2022 | Soejima ............. | G01C 19/5607 |
| 2004/0085163 | A1 * | 5/2004 | Kikushima .............. | H03H 3/04 333/200 |

(Continued)

FOREIGN PATENT DOCUMENTS

| | | |
|---|---|---|
| JP | 2006-322740 A | 11/2006 |
| JP | 2009-088806 | 4/2009 |

(Continued)

*Primary Examiner* — J. San Martin
(74) *Attorney, Agent, or Firm* — Rankin, Hill & Clark LLP

(57) ABSTRACT

A vibrating arm of a vibrator element has a first surface, a second surface at an opposite side to the first surface in a Z direction, a first side surface and a second side surface as side surfaces, and a third side surface as a tip surface. At least one of the first side surface, the second side surface, and the third side surface includes a first side surface part tilted with respect to a Z direction, and a second side surface part tilted toward the first surface or the second surface with respect to the first side surface part. The first weight is arranged so that an outer edge of the first weight is located at inner side of innermost parts in the first side surface part and the second side surface part, or at the same position as the innermost parts when viewed from the Z direction.

9 Claims, 22 Drawing Sheets

(56)　　　　　　　References Cited

U.S. PATENT DOCUMENTS

| | | | |
|---|---|---|---|
| 2016/0308510 A1* | 10/2016 | Ishino ...................... | H03H 9/21 |
| 2019/0229706 A1 | 7/2019 | Ogura et al. | |
| 2021/0313959 A1 | 10/2021 | Ogura et al. | |
| 2021/0408365 A1* | 12/2021 | Ogura .................... | H10N 30/20 |
| 2023/0109944 A1 | 4/2023 | Ogura et al. | |
| 2023/0387885 A1 | 11/2023 | Ogura et al. | |

FOREIGN PATENT DOCUMENTS

| | | | | |
|---|---|---|---|---|
| JP | 2009-232376 | | 10/2009 | |
| JP | 2009-253622 A | | 10/2009 | |
| JP | 2016139860 A | * | 8/2016 | .............. H03H 9/21 |
| JP | 2019-128211 A | | 8/2019 | |

* cited by examiner

VIBRATOR ELEMENT, VIBRATOR DEVICE, AND METHOD OF MANUFACTURING VIBRATOR ELEMENT

The present application is based on, and claims priority from JP Application Serial Number 2021-099985, filed Jun. 16, 2021, the disclosure of which is hereby incorporated by reference herein in its entirety.

BACKGROUND

1. Technical Field

The present disclosure relates to a vibrator element, a vibrator device, and a method of manufacturing a vibrator element.

2. Related Art

In the past, as disclosed in JP-A-2009-88806 (Document 1), there has been known a frequency adjustment method of a quartz crystal vibrator for adjusting a frequency by forming a frequency adjusting metal film on a first surface, a first side surface having a protruding part in a cross-sectional surface, and a second side surface in a vibrator element of the quartz crystal vibrator, making a laser enter a second surface opposed to the first surface, and removing a part of the frequency adjusting metal film.

Further, it is known that it is possible to prevent the frequency adjusting metal film which should be removed from remaining as a burr in the frequency adjusting metal film by making an incident angle of the laser acute from the second side surface side toward the first side surface as described in Document 1.

However, in the frequency adjustment method of the quartz crystal vibrator described in Document 1, since the incident angle of the laser is made acute from the second side surface toward the first side surface, the laser is deflected or blocked by the second side surface when removing the frequency adjusting metal film at the second side surface side. Therefore, there is a possibility that the frequency adjusting metal film at the second side surface side is not sufficiently irradiated with the laser to form a foreign particle such as a burr. There is a problem that the frequency of the quartz crystal vibrator varies when the foreign particle such as a burr drops on a manufacturing process or after completion of a product.

SUMMARY

A vibrator element includes a base part, a vibrating arm which includes a first surface, a second surface at an opposite side to the first surface in a direction along a Z axis, a first side surface, a second side surface at an opposite side to the first side surface in a direction along an X axis perpendicular to the Z direction, and a third side surface located at an opposite side to the base part, and extends from the base part in a direction along a Y axis perpendicular to the Z axis and the X axis, and a first weight arranged on the second surface, wherein at least one of the first side surface, the second side surface, and the third side surface includes a first side surface part tilted with respect to a direction along the Z axis, and a second side surface part tilted toward the first surface or the second surface with respect to the first side surface part, and the first weight is arranged so that an outer edge part of the first weight is located at an inner side of innermost parts in the first side surface part and the second side surface part, or at the same position as the innermost parts when viewed from a direction along the Z axis.

A vibrator device includes the vibrator element described above, and a package configured to house the vibrator element.

A method of manufacturing a vibrator element includes a frequency adjustment method of adjusting a frequency of the vibrator element, wherein the vibrator element includes a base part, a vibrating arm which includes a first surface, a second surface at an opposite side to the first surface in a direction along a Z axis, a first side surface, a second side surface at an opposite side to the first side surface in a direction along an X axis perpendicular to the Z direction, and a third side surface located at an opposite side to the base part, and extends from the base part in a direction along a Y axis perpendicular to the Z axis and the X axis, and a first weight arranged on the second surface, at least one of the first side surface, the second side surface, and the third side surface includes a first side surface part tilted with respect to a direction along the Z axis, and a second side surface part tilted toward the first surface or the second surface with respect to the first side surface part, the first weight is arranged so that an outer edge part of the first weight is located at an inner side of innermost parts in the first side surface part and the second side surface part, or at the same position as the innermost parts when viewed from a direction along the Z axis, and the frequency adjustment method includes irradiating at least a part of the first weight with a laser beam from the first surface side in a direction along the Z axis to remove the at least a part of the first weight to thereby change an oscillation frequency of the vibrator element.

BRIEF DESCRIPTION OF THE DRAWINGS

FIG. 10 is a cross-sectional view along the line F-F in FIG. 9.

FIG. 21 is a cross-sectional view along the line T-T in FIG. 20.

FIG. 22 is a cross-sectional view showing a vibrator device according to a fourth embodiment.

DESCRIPTION OF EXEMPLARY EMBODIMENTS

1. Embodiment 1

A vibrator element 1 according to Embodiment 1 will be described with reference to FIG. 1 through FIG. 6.

For the sake of convenience of explanation, in each of the following drawings, there are illustrated an X axis, a Y axis, and a Z axis as three axes perpendicular to each other. A direction along the X axis is referred to as an "X direction," a direction along the Y axis is referred to as a "Y direction," and a direction along the Z axis is referred to as a "Z direction." Further, an arrow side of each of the axes is also referred to as a "positive side," and an opposite side to the arrow is also referred to as a "negative side." Further, the positive side in the Z direction is also referred to as an "upper side," and the negative side in the Z direction is also referred to as a "lower side." Further, in a plan view from the Z direction, the description will be presented assuming that a surface at the positive side in the Z direction as an upper surface, and a surface at the negative side in the Z direction which is an opposite side to the upper surface as a lower surface. It should be noted that in the present embodiment, as described later, the X axis, the Y axis, and the Z axis correspond to the crystal axes of quartz crystal. Further, in each of the drawings described below, description with scales different from those in the actual configuration is adopted in some cases for making the explanation easy to understand.

Figure 1:
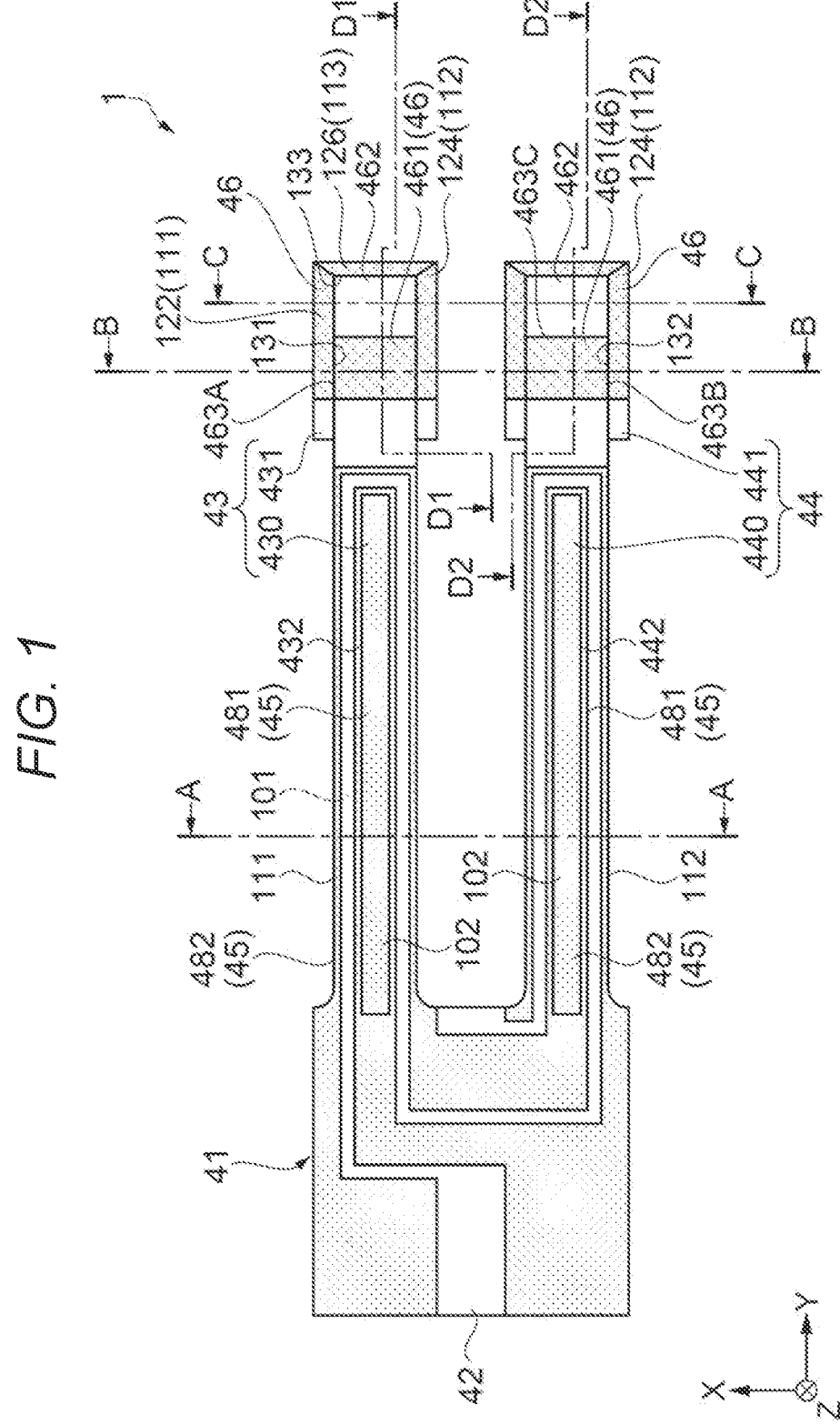
FIG. 1 is a plan view showing a vibrator element according to Embodiment 1.

As shown in FIG. 1, the vibrator element 1 is a tuning-fork quartz crystal vibrator.

The vibrator element 1 has a vibrating body 41, electrodes 45 for vibrating the vibrating body 41, and metal films 46 for adjusting the frequency of the vibrating body 41.

The vibrating body 41 is formed of a Z-cut quartz crystal plate, and has a plate-like shape having a spread in an X-Y plane defined by the X axis and the Y axis, and having a thickness in the Z direction. It should be noted that the X axis, the Y axis, and the Z axis correspond respectively to the electrical axis, the mechanical axis, and the optical axis as the crystal axes of quartz crystal.

The vibrating body 41 has a first surface 101, and a second surface 102 located at an opposite side to the first surface 101 in the Z direction. In the present embodiment, the first surface 101 is a principal surface at the positive side in the Z direction in the vibrating body 41, and the second surface 102 is a principal surface at the negative side in the Z direction in the vibrating body 41. In other words, the first surface 101 is an upper surface of the vibrating body 41, and the second surface 102 is a lower surface of the vibrating body 41.

It should be noted that the constituent material of the vibrating body 41 is not particularly limited, it is possible to use a variety of types of piezoelectric material such as lead zirconate titanate, and it is possible to use a material other than the piezoelectric material such as a silicon substrate.

The vibrating body 41 has a base part 42, and a pair of vibrating arms 43, 44 extending in the Y direction from the base part 42. In the present embodiment, the vibrating arms 43, 44 extend from the base part 42 toward the positive side in the Y direction.

The vibrating arms 43, 44 each include a first surface 101 as an upper surface, a second surface 102 as a lower surface, a first side surface 111 for coupling the first surface 101 and the second surface 102 to each other, a second side surface 112 at an opposite side to the first side surface 111 in the X direction, and a third side surface 113 which is located at an opposite side to the base part 42, and couples the first surface 101 and the second surface 102 to each other. In the present embodiment, the first side surface 111 is a side surface at the positive side in the X direction in each of the vibrating arms 43, 44, and the second side surface 112 is a side surface at the negative side in the X direction in each of the vibrating arms 43, 44. The third side surface 113 is a side surface at the positive side in the Y direction in each of the vibrating arms 43, 44, and in other words, a tip surface of each of the vibrating arms 43, 44.

The vibrating arms 43, 44 respectively have arm parts 430, 440, and weight parts 431, 441. The weight parts 431, 441 are respectively disposed in the tip portions at the opposite side to the base part 42 in the drive arms 43, 44. The arm parts 430, 440 are disposed at the base part 42 side of the weight parts 431, 441, and couple the weight parts 431, 441 and the base part 42 to each other, respectively.

The arm parts 430, 440 of the vibrating arms 43, 44 are provided with the electrodes 45. The weight parts 431, 441 of the vibrating arms 43, 44 are provided with the metal films 46.

First, the arm parts 430, 440 of the vibrating arms 43, 44 will be described.

Figure 2:
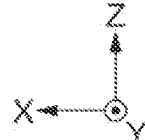
FIG. 2 is a cross-sectional view along the line A-A in FIG. 1.

As shown in FIG. 1 and FIG. 2, the arm part 430 of the vibrating arm 43 has a recessed part 432 shaped like a groove opening on the first surface 101, and a recessed part 433 shaped like a groove opening on the second surface 102. Similarly, the arm part 440 of the vibrating arm 44 has a recessed part 442 shaped like a groove opening on the first surface 101, and a recessed part 443 shaped like a groove opening on the second surface 102. As described above, the arm parts 430, 440 each have a substantially H-like cross-sectional shape having the recessed parts 432, 442 shaped like a groove on the first surface 101, and having the recessed parts 433, 443 shaped like a groove on the second surface 102.

In the arm parts 430, 440 of the vibrating arms 43, 44, there are arranged signal electrodes 481 and ground electrodes 482 as the electrodes 45. The signal electrodes 481 are arranged on the first surface 101 and the second surface 102 of the vibrating arm 43, and the first side surface 111 and the second side surface 112 of the vibrating arm 44. The ground electrodes 482 are arranged on the first side surface 111 and the second side surface 112 of the vibrating arm 43, and the first surface 101 and the second surface 102 of the vibrating arm 44.

By applying a drive signal to the signal electrodes 481, the vibrating arms 43, 44 flexurally vibrate so as to repeat coming close to each other and getting away from each other.

Then, the weight parts 431, 441 of the vibrating arms 43, 44 will be described.

Figure 3:
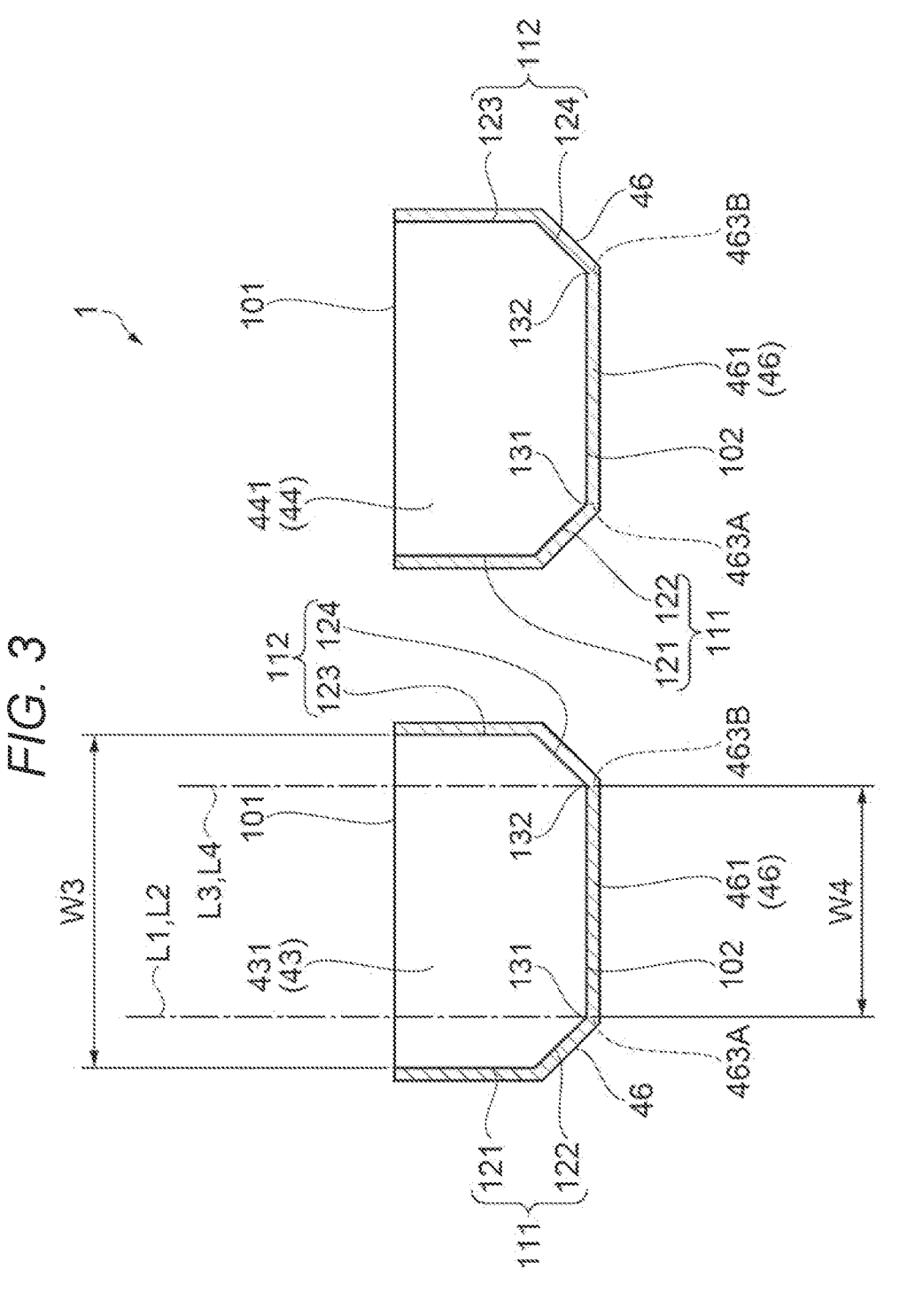
FIG. 3 is a cross-sectional view along the line B-B in FIG. 1.
Figure 4:
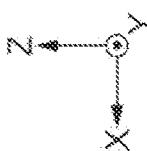
FIG. 4 is a cross-sectional view along the line C-C in FIG. 1.

As shown in FIG. 3 and FIG. 4, the first side surface 111 in the weight part 431 of the vibrating arm 43 includes an upper side surface part 121 and a lower side surface part 122. An upper end of the upper side surface part 121 in the first side surface 111 is coupled to the first surface 101. A lower end of the upper side surface part 121 in the first side surface 111 is coupled to an upper end of the lower side surface part 122 in the first side surface 111. A lower end of the lower side surface part 122 in the first side surface 111 is coupled to the second surface 102.

In the present embodiment, the upper side surface part 121 of the first side surface 111 in the weight part 431 is parallel to the Z direction, and the lower side surface part 122 of the first side surface 111 in the weight part 431 is tilted with respect to the Z direction.

In other words, the lower side surface part 122 of the first side surface 111 in the weight part 431 is a first side surface part in the present disclosure tilted with respect to the Z direction. Further, the upper side surface part 121 of the first side surface 111 in the weight part 431 is a second side surface part in the present disclosure tilted toward the first surface 101 with respect to the first side surface part.

In other words, the first side surface 111 in the weight part 431 includes the lower side surface part 122 as the first side surface part tilted with respect to the Z direction, and the upper side surface part 121 as the second side surface part tilted toward the first surface 101 with respect to the lower side surface part 122 as the first side surface part.

Further, the second side surface 112 in the weight part 431 of the vibrating arm 43 includes an upper side surface part 123 and a lower side surface part 124. An upper end of the upper side surface part 123 in the second side surface 112 is coupled to the first surface 101. A lower end of the upper side surface part 123 in the second side surface 112 is coupled to an upper end of the lower side surface part 124 in the second side surface 112. A lower end of the lower side surface part 124 in the second side surface 112 is coupled to the second surface 102.

In the present embodiment, the upper side surface part 123 of the second side surface 112 in the weight part 431 is parallel to the Z direction, and the lower side surface part 124 of the second side surface 112 in the weight part 431 is tilted with respect to the Z direction.

In other words, the lower side surface part 124 of the second side surface 112 in the weight part 431 is the first side surface part in the present disclosure tilted with respect to the Z direction. Further, the upper side surface part 123 of the second side surface 112 in the weight part 431 is the second side surface part in the present disclosure tilted toward the first surface 101 with respect to the first side surface part.

In other words, the second side surface 112 in the weight part 431 includes the lower side surface part 124 as the first side surface part tilted with respect to the Z direction, and the upper side surface part 123 as the second side surface part tilted toward the first surface 101 with respect to the lower side surface part 124 as the first side surface part.

Figure 5:
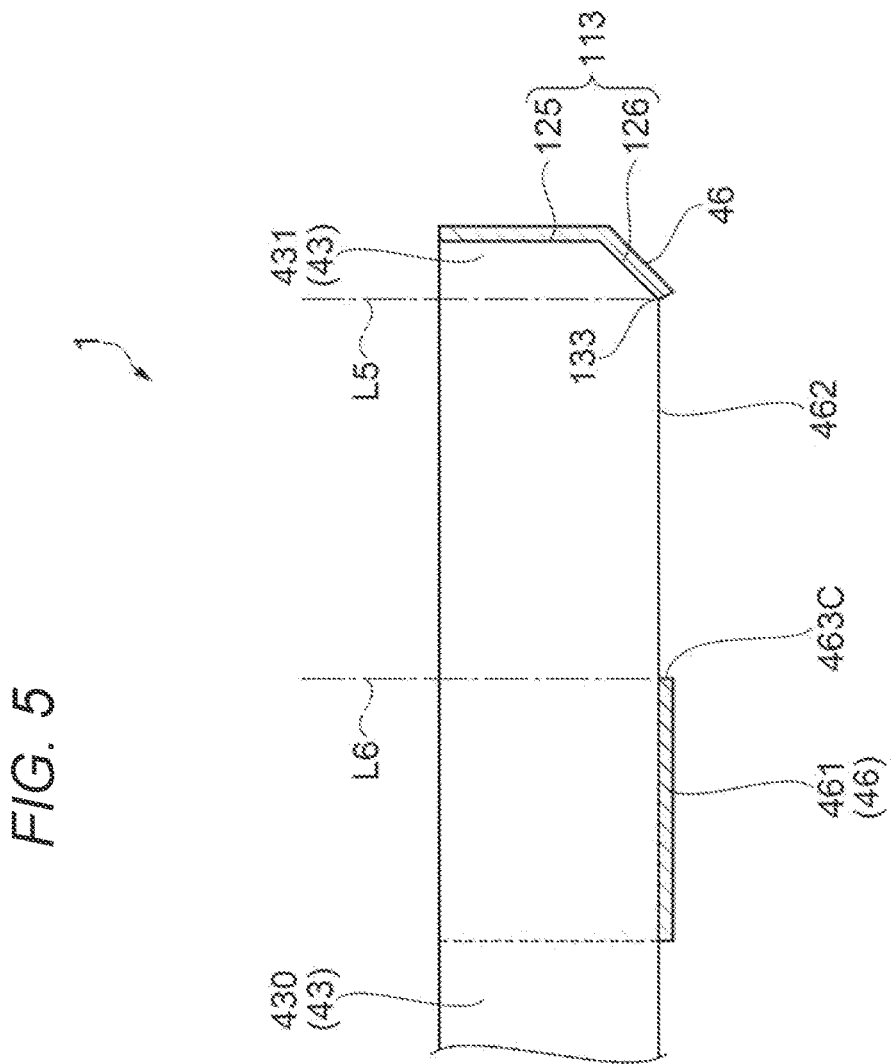
FIG. 5 is a cross-sectional view along the line D1-D1 in FIG. 1.
Figure 5:
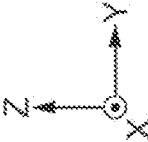
Figure 6:
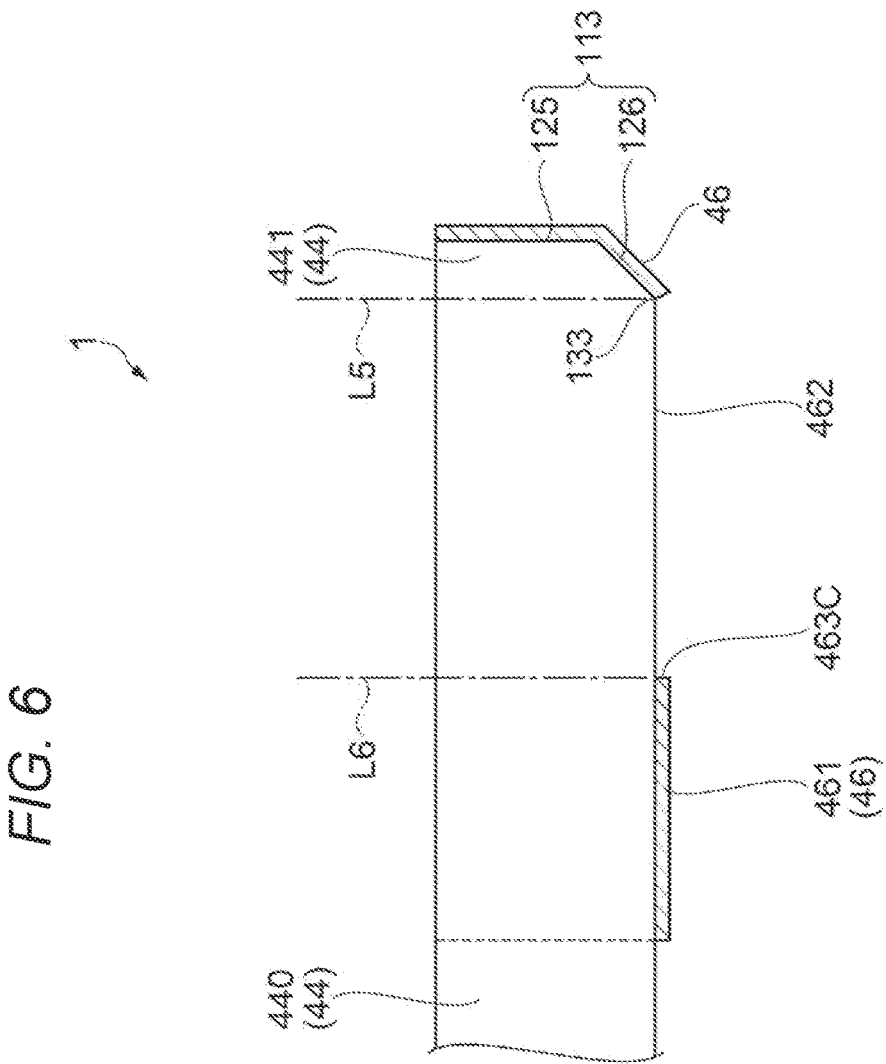
FIG. 6 is a cross-sectional view along the line D2-D2 in FIG. 1.
Figure 6:
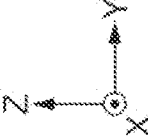

As shown in FIG. 5, the third side surface 113 in the weight part 431 of the vibrating arm 43 includes an upper side surface part 125 and a lower side surface part 126. An upper end of the upper side surface part 125 in the third side surface 113 is coupled to the first surface 101. A lower end of the upper side surface part 125 in the third side surface 113 is coupled to an upper end of the lower side surface part 126 in the third side surface 113. A lower end of the lower side surface part 126 in the third side surface 113 is coupled to the second surface 102.

In the present embodiment, the upper side surface part 125 of the third side surface 113 in the weight part 431 is parallel to the Z direction, and the lower side surface part 126 of the third side surface 113 in the weight part 431 is tilted with respect to the Z direction.

In other words, the lower side surface part 126 of the third side surface 113 in the weight part 431 is the first side surface part in the present disclosure tilted with respect to the Z direction. Further, the upper side surface part 125 of the third side surface 113 in the weight part 431 is the second side surface part in the present disclosure tilted toward the first surface 101 with respect to the first side surface part.

In other words, the third side surface 113 in the weight part 431 includes the lower side surface part 126 as the first side surface part tilted with respect to the Z direction, and the upper side surface part 125 as the second side surface part tilted toward the first surface 101 with respect to the lower side surface part 126 as the first side surface part.

Further, as shown in FIG. 1 and FIG. 3 through FIG. 6, the weight part 441 of the vibrating arm 44 is the same in basic configuration as the weight part 431 of the vibrating arm 43. The first side surface 111 in the weight part 441 of the vibrating arm 44 includes the lower side surface part 122 as the first side surface part tilted with respect to the Z direction, and the upper side surface part 121 as the second side surface part tilted toward the first surface 101 with respect to the lower side surface part 122 as the first side surface part. The second side surface 112 in the weight part 441 includes the lower side surface part 124 as the first side surface part tilted with respect to the Z direction, and the upper side surface part 123 as the second side surface part tilted toward the first surface 101 with respect to the lower side surface part 124 as the first side surface part. The third side surface 113 in the weight part 441 includes the lower side surface part 126 as the first side surface part tilted with respect to the Z direction, and the upper side surface part 125 as the second side surface part tilted toward the first surface 101 with respect to the lower side surface part 126 as the first side surface part.

Then, the metal films 46 provided to the weight parts 431, 441 of the vibrating arms 43, 44 will be described.

As shown in FIG. 1 and FIG. 3 through FIG. 6, the metal films 46 are arranged on the second surfaces 102, the first side surfaces 111, the second side surfaces 112, and the third side surfaces 113 in the weight parts 431, 441 of the vibrating arms 43, 44, respectively. The metal films 46 are for adjusting the resonance frequency of the vibrator element 1, or adjusting the vibration balance between the vibrating arms 43, 44. As described later, by irradiating the metal films 46 with a laser beam LB to remove a part of the metal films 46 to thereby reduce the mass of the vibrating arms 43, 44 in a frequency adjustment process included in a frequency adjustment method for the vibrator element 1, it is possible to adjust the resonance frequency of the vibrator element 1. It should be noted that the material constituting the metal films 46 is not particularly limited, and can be constituted by a metal material consisting primarily of, for example, gold (Au), silver (Ag), or aluminum (Al). In the present embodiment, the metal films 46 are formed of gold (Au).

The metal films 46 arranged on the second surfaces 102 of the weight parts 431, 441 of the vibrating arms 43, are each a first weight 461 arranged on the second surfaces 102 in the present disclosure.

FIG. 1 and FIG. 3 through FIG. 6 show a state in which the frequency adjustment process has been completed, namely a part of the first weights 461 is irradiated with the laser beam LB and is removed. As shown in FIG. 1 and FIG. 4 through FIG. 6, removal areas 462 in the second surfaces 102 are areas which are irradiated with the laser beam LB, and from which the first weights 461 are removed in the frequency adjustment process.

In the present embodiment, the first weight 461 and the removal area 462 in the second surface 102 are arranged side by side in the Y direction as a longitudinal direction of the vibrating arms 43, 44, and the removal area 462 is located at the tip side of the vibrating arms 43, 44, namely the positive side in the Y direction with respect to the first weight 461. By arranging the removal area 462 closer to the tip side of the vibrating arms 43, 44 than the first weight 461, in other words, by removing the tip side of the first weight 461, in such a manner, the frequency variation per unit mass of the first weight 461 thus removed can be made greater. Therefore, it is possible to ensure a sufficient frequency adjustment range in the frequency adjustment process. It should be noted that the arrangement of the first weight 461 and the removal area 462 is not particularly limited, and for example, it is possible for the removal area 462 to be located at the negative side in the Y direction of the first weight 461.

Then, an arrangement of the first weights 461 with respect to the first side surfaces 111, the second side surfaces 112, and the third side surfaces 113 in the weight parts 431, 441 of the vibrating arms 43, 44 will be described.

First, the arrangement of the first weight 461 with respect to the first side surface 111 in the weight part 431 of the vibrating arm 43 will be described.

As shown in FIG. 3, and as described above, the lower side surface part 122 of the first side surface 111 in the weight part 431 is tilted with respect to the Z direction. Specifically, the lower side surface part 122 of the first side surface 111 in the weight part 431 is tilted toward the inside of the weight part 431 from the first surface 101 toward the second surface 102. In other words, in the first side surface 111 of the weight part 431, innermost parts 131 in the lower side surface part 122 as the first side surface part and the upper side surface part 121 as the second side surface part each become a lower end part of the lower side surface part 122 where the lower side surface part 122 is coupled to the second surface 102.

It should be noted that the "innermost part" in the present disclosure means a portion located at the innermost side of the weight parts 431, 441 in each of the first side surface 111, the second side surface 112, and the third side surface 113 when imaging the first side surface 111, the second side surface 112, and the third side surface 113 from the Z direction.

In the first side surface 111 of the weight part 431, assuming an imaginary line which passes the innermost parts 131 in the lower side surface part 122 as the first side surface part and the upper side surface part 121 as the second side surface part, and is parallel to the Z direction as an imaginary line L1, and an imaginary line which passes an outer edge part 463A at the first side surface 111 side in the first weight 461 arranged on the second surface 102 of the weight part 431, and is parallel to the Z direction as an imaginary line L2, the imaginary line L1 and the imaginary line L2 are located at the same position in a side view from the Y direction perpendicular to the Z direction.

It should be noted that the words "the same" and "equal" mean that two things are substantially the same as each other, or substantially equal to each other including the production tolerance and so on.

Further, as shown in FIG. 1, in the weight part 431, the innermost parts 131 in the lower side surface part 122 as the first side surface part and the upper side surface part 121 as the second side surface part in the first side surface 111, and the outer edge part 463A at the first side surface 111 side in the first weight 461 are located at the same position. In other words, the first weight 461 in the weight part 431 is arranged so that the outer edge part 463A at the first side surface 111 side in the first weight 461 is located at the same position as those of the innermost parts 131 in the lower side surface part 122 as the first side surface part and the upper side surface part 121 as the second side surface part in the first side surface 111 when viewed from the Z direction.

By arranging the first weight 461 so that the outer edge part 463A at the first side surface 111 side in the first weight 461 is located at the same position as those of the innermost parts 131 in the lower side surface part 122 as the first side surface part and the upper side surface part 121 as the second side surface part in the first side surface 111 when viewed from the Z direction as described above, it is possible to prevent the refraction or the blockage of the laser beam LB in the lower side surface part 122 and the upper side surface part 121 of the first side surface 111 when irradiating the first weight 461 with the laser beam LB. Therefore, it is possible to sufficiently irradiate the first weight 461 with the laser beam LB, and thus the foreign particle such as a burr is prevented from being formed, and therefore, it is possible to provide the vibrator element 1 in which the variation in frequency due to the drop of the foreign particle such as a burr is difficult to occur.

Then, the arrangement of the first weight 461 with respect to the second side surface 112 in the weight part 431 of the vibrating arm 43 will be described.

As shown in FIG. 3, and as described above, the lower side surface part 124 of the second side surface 112 in the weight part 431 is tilted with respect to the Z direction. Specifically, the lower side surface part 124 of the second side surface 112 in the weight part 431 is tilted toward the inside of the weight part 431 from the first surface 101 toward the second surface 102. In other words, in the second side surface 112 of the weight part 431, innermost parts 132 in the lower side surface part 124 as the first side surface part and the upper side surface part 123 as the second side surface part each become a lower end part of the lower side surface part 124 where the lower side surface part 124 is coupled to the second surface 102.

In the second side surface 112 of the weight part 431, assuming an imaginary line which passes the innermost parts 132 in the lower side surface part 124 as the first side surface part and the upper side surface part 123 as the second side surface part, and is parallel to the Z direction as an imaginary line L3, and an imaginary line which passes an outer edge part 463B at the second side surface 112 side in the first weight 461 arranged on the second surface 102 of the weight part 431, and is parallel to the Z direction as an imaginary line L4, the imaginary line L3 and the imaginary line L4 are located at the same position in the side view from the Y direction perpendicular to the Z direction.

Further, as shown in FIG. 1, in the weight part 431, the innermost parts 132 in the lower side surface part 124 as the first side surface part and the upper side surface part 123 as the second side surface part in the second side surface 112, and the outer edge part 463B at the second side surface 112 side in the first weight 461 are located at the same position. In other words, the first weight 461 in the weight part 431 is arranged so that the outer edge part 463B at the second side surface 112 side in the first weight 461 is located at the same position as those of the innermost parts 132 in the lower side surface part 124 as the first side surface part and the upper side surface part 123 as the second side surface part in the second side surface 112 when viewed from the Z direction.

By arranging the first weight 461 so that the outer edge part 463B at the second side surface 112 side in the first weight 461 is located at the same position as those of the innermost parts 132 in the lower side surface part 124 as the first side surface part and the upper side surface part 123 as the second side surface part in the second side surface 112 when viewed from the Z direction as described above, it is possible to prevent the refraction or the blockage of the laser beam LB also in the second side surface 112 similarly to the first side surface 111. Therefore, it is possible to sufficiently irradiate the first weight 461 with the laser beam LB, and thus occurrence of the foreign particle such as a burr is prevented, and it is possible to provide the vibrator element 1 in which the variation in frequency is difficult to occur.

Then, the arrangement of the first weight 461 with respect to the third side surface 113 in the weight part 431 of the vibrating arm 43 will be described.

As shown in FIG. 5, and as described above, the lower side surface part 126 of the third side surface 113 in the weight part 431 is tilted with respect to the Z direction. Specifically, the lower side surface part 126 of the third side surface 113 in the weight part 431 is tilted toward the inside of the weight part 431 from the first surface 101 toward the second surface 102. In other words, in the third side surface 113 of the weight part 431, innermost parts 133 in the lower side surface part 126 as the first side surface part and the upper side surface part 125 as the second side surface part each become a lower end part of the lower side surface part 126 where the lower side surface part 126 is coupled to the second surface 102.

In the third side surface 113 of the weight part 431, assuming an imaginary line which passes the innermost parts 133 in the lower side surface part 126 as the first side surface part and the upper side surface part 125 as the second side surface part, and is parallel to the Z direction as an imaginary line L5, and an imaginary line which passes an outer edge part 463C at the third side surface 113 side in the first weight 461 arranged on the second surface 102 of the weight part 431, and is parallel to the Z direction as an imaginary line L6, the imaginary line L6 is located at the negative side in the Y direction with respect to the imaginary line L5 in a side view from the X direction perpendicular to the Z direction. In other words, the imaginary line L6 which passes the outer edge part 463C and is parallel to the Z direction is located at the negative side in the Y direction as the direction toward the inside of the imaginary line L5 which passes the innermost parts 133 in the first side surface part and the second side surface part of the third side surface 113, and is parallel to the Z direction.

Further, as shown in FIG. 1, in the weight part 431, the outer edge part 463C at the third side surface 113 side in the first weight 461 is located inner side of the innermost parts 133 in the lower side surface part 126 as the first side surface part and the upper side surface part 125 as the second side surface part in the third side surface 113.

By arranging the first weight 461 so that the outer edge part 463C at the third side surface 113 side in the first weight 461 is located at the inner side of the innermost parts 133 in the lower side surface part 126 as the first side surface part and the upper side surface part 125 as the second side surface part in the third side surface 113 when viewed from the Z direction as described above, it is possible to prevent the refraction or the blockage of the laser beam LB also in the third side surface 113 similarly to the first side surface 111 and the second side surface 112. Therefore, it is possible to sufficiently irradiate the first weight 461 with the laser beam LB, and thus occurrence of the foreign particle such as a burr is prevented, and it is possible to provide the vibrator element 1 in which the variation in frequency is difficult to occur.

Then, an arrangement of the first weights 461 with respect to the first side surfaces 111, the second side surfaces 112, and the third side surfaces 113 in the weight part 441 of the vibrating arms 44 will be described.

As shown in FIG. 1 and FIG. 3 through FIG. 6, the weight part 441 of the vibrating arm 44 is the same in basic configuration as the weight part 431 of the vibrating arm 43. Therefore, an arrangement of the first weight 461 with respect to the first side surface 111, the second side surface 112, and the third side surface 113 in the weight part 441 of the vibrating arm 44 are substantially the same as those of the weight part 431 of the vibrating arm 43. Specifically, the first weight 461 is arranged so that the outer edge parts 463A, 463B of the first weight 461 are located at the same positions as those of the innermost parts 131 in the first side surface part and the second side surface part of the first side surface 111, and the innermost parts 132 in the first side surface part and the second side surface part of the second side surface 112, respectively, when viewed from the Z direction. The first weight 461 is arranged so that the outer edge part 463C of the first weight 461 is located at the inner side of the innermost parts 133 in the first side surface part and the second side surface part of the third side surface 113 when viewed from the Z direction. Thus, it is possible to prevent the refraction or the blockage of the laser beam LB by the first side surface 111, the second side surface 112, and the third side surface 113 in the weight part 441. Therefore, it is possible to sufficiently irradiate the first weight 461 with the laser beam LB, and thus occurrence of the foreign particle such as a burr is prevented, and it is possible to provide the vibrator element 1 in which the variation in frequency is difficult to occur.

As described above, in the present embodiment, the three side surfaces, namely the first side surface 111, the second side surface 112, and the third side surface 113, in the weight parts 431, 441 of the vibrating arms 43, 44 include the lower side surface parts 122, 124, and 126 as the first side surface part tilted with respect to the Z direction, and the upper side surface parts 121, 123, and 125 as the second side surface part tilted toward the first surface 101 with respect to the first side surface part, respectively. Further, the first weight 461 is arranged so that the outer edge parts 463A, 463B, and 463C of the first weight 461 are located at the inner side of the innermost parts 131, 132, and 133 in the lower side surface parts 122, 124, and 126 as the first side surface part and the upper side surface parts 121, 123, and 125 as the second side surface part, or at the same positions as those of the innermost parts 131, 132, and 133, respectively, when viewed from the Z direction. It should be noted that it is possible to arrange that the configuration of the present embodiment is adopted as at least one of the first side surface 111, the second side surface 112, and the third side surface 113. It should be noted that when adopting the configuration of the present embodiment as the three side surfaces, namely the first side surface 111, the second side surface 112, and the third side surface 113, the foreign particle such as a burr is prevented from occurring in the three side surfaces, namely the first side surface 111, the second side surface 112, and the third side surface 113, and therefore, it is possible to provide the vibrator element 1 in which the variation in frequency is more difficult to occur compared to when adopting the configuration of the present embodiment as one or two of the three side surfaces, namely the first side surface 111, the second side surface 112, and the third side surface 113.

Further, by adopting the configuration of the present embodiment as at least one of the first side surface 111 and the second side surface 112 in the weight parts 431, 441 of the vibrating arms 43, 44, it is possible to provide the tuning-fork quartz crystal vibrator in which a variation in frequency is difficult to occur as the vibrator element 1. Specifically, when forming the tuning-fork quartz crystal vibrator using wet etching, the first side surface 111 and the second side surface 112 are apt to have a shape having a protruding part in a cross-sectional surface as in the related art due to anisotropy of quartz crystal, but even with the shape having the protruding part in the cross-sectional surface, it is possible to prevent the refraction or the blockage of the laser beam LB in the first side surface 111 or the second side surface 112 when irradiating the first weight 461 with the laser beam LB. Therefore, it is possible to provide the tuning-fork quartz crystal vibrator in which the variation in frequency is difficult to occur as the vibrator element 1.

Further, by adopting the configuration of the present embodiment as the third side surface 113 in the weight parts 431, 441 of the vibrating arms 43, 44, it is possible to increase an amount of the variation in frequency in the frequency adjustment process of the vibrator element 1 described later, and at the same time, it is possible to provide the vibrator element 1 in which the variation in frequency after the frequency adjustment process is difficult to occur. Specifically, the third side surface 113 is a tip surface of each of the vibrating arms 43, 44, and by preventing the refraction or the blockage of the laser beam LB on the third side surfaces 113 as the tip surfaces of the vibrating arms 43, 44, it becomes easy to remove the first weight 461 from the tip side of the vibrating arms 43, 44. Therefore, it is possible to increase the amount of the variation in frequency in the frequency adjustment process. Further, since it is possible to prevent the occurrence of the foreign particle such as a burr in the tip side of the vibrating arms 43, 44, it is possible to provide the vibrator element 1 in which the variation in frequency after the frequency adjustment process is difficult to occur.

Further, as shown in FIG. 3, the width W4 in the X direction of the second surface 102 of each of the weight parts 431, 441 is smaller than the width W3 in the X direction in the first surface 101 of each of the weight parts 431, 441. Thus, it becomes possible to form the first weight 461 in the whole width W4 in the X direction in the second surface 102 of each of the weight parts 431, 441, and it is possible to provide the vibrator element 1 easy to manufacture.

Further, as shown in FIG. 2, the width W1 in the X direction of the first surface 101 of each of the arm parts 430, 440 and the width W2 in the X direction in the second surface 102 of each of the arm parts 430, 440 are equal to each other. As described above, the arm parts 430, 440 are provided with the signal electrodes 481 and the ground electrodes 482, and by applying a drive signal to the signal electrodes 481, the vibrating arms 43, 44 vibrate. By making the width W1 in the X direction in the first surface 101 of each of the arm parts 430, 440 and the width W2 in the X direction in the second surface 102 of each of the arm parts 430, 440 equal to each other, the vibration balance of the vibrating arms 43, 44 is improved, and thus, it is possible to reduce the vibration leakage. Thus, it is possible to provide the vibrator element 1 excellent in vibration efficiency.

Then, a method of manufacturing the vibrator element 1 according to the present embodiment will be described with reference to FIG. 7 through FIG. 11.

Figure 7:
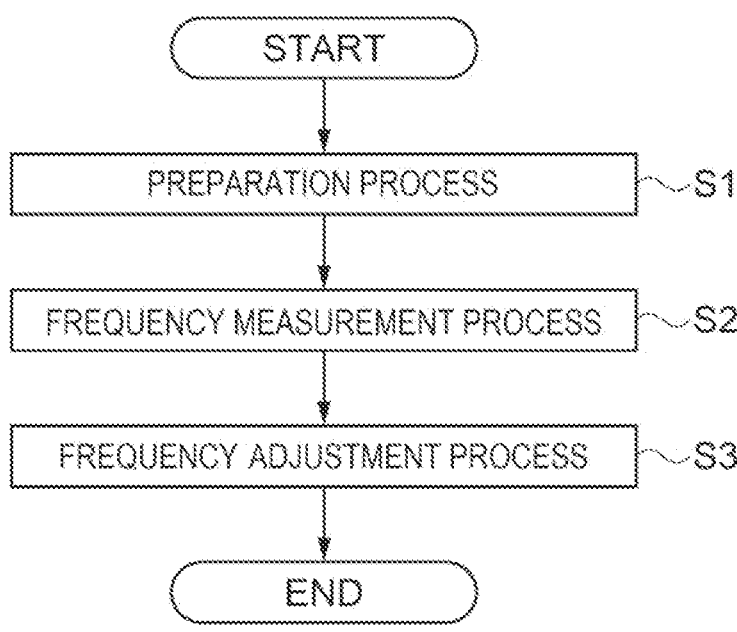
FIG. 7 is a flowchart showing a method of manufacturing the vibrator element according to Embodiment 1.

The method of manufacturing the vibrator element 1 includes the frequency adjustment method of adjusting the frequency of the vibrator element 1. Further, as shown in FIG. 7, the frequency adjustment method of adjusting the frequency of the vibrator element 1 includes a preparation process of preparing the vibrator element 1, a frequency measurement process of measuring the oscillation frequency of the vibrator element 1, and a frequency adjustment process of changing the oscillation frequency of the vibrator element 1 to adjust the oscillation frequency of the vibrator element 1 to a frequency as a target value.

1.1 Preparation Process

Figure 8:
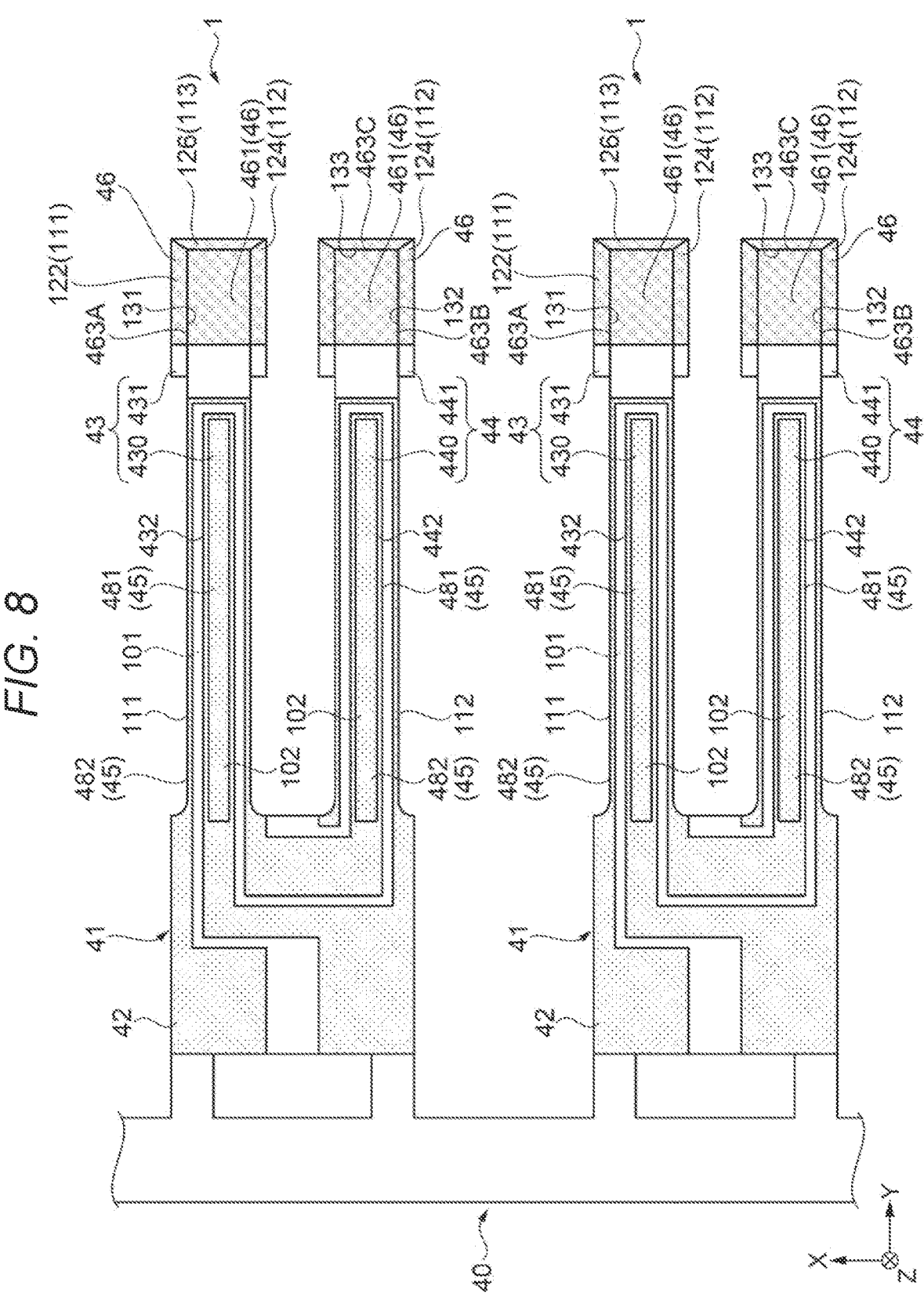
FIG. 8 is a plan view showing the vibrator elements according to Embodiment 1.

First, in the step S1, as shown in FIG. 8, by preparing the quartz crystal wafer 40 and patterning the quartz crystal wafer 40 using a photolithography technique and an etching technique, a plurality of vibrating bodies 41 is provided to the quartz crystal wafer 40. Then, the electrodes 45 are formed on the surfaces of the vibrating bodies 41 using sputtering and so on, and further, the metal films 46 are provided to the weight parts 431, 441 of the vibrating arms 43, 44 using vapor deposition and so on. In the present embodiment, as described above, the metal films 46 are formed on the second surfaces 102, the first side surfaces 111, the second side surfaces 112, and the third side surfaces 113 of the weight parts 431, 441. The metal films 46 formed on the second surfaces 102 correspond to the first weights 461.

1.2 Frequency Measurement Process

Then, in the step S2, for example, a probe of the frequency measurement device having an oscillation circuit is made to have contact with the electrode 45 formed on the surface of the vibrating body 41 to measure the oscillation frequency of the vibrator element 1.

1.3 Frequency Adjustment Process

Figure 9:
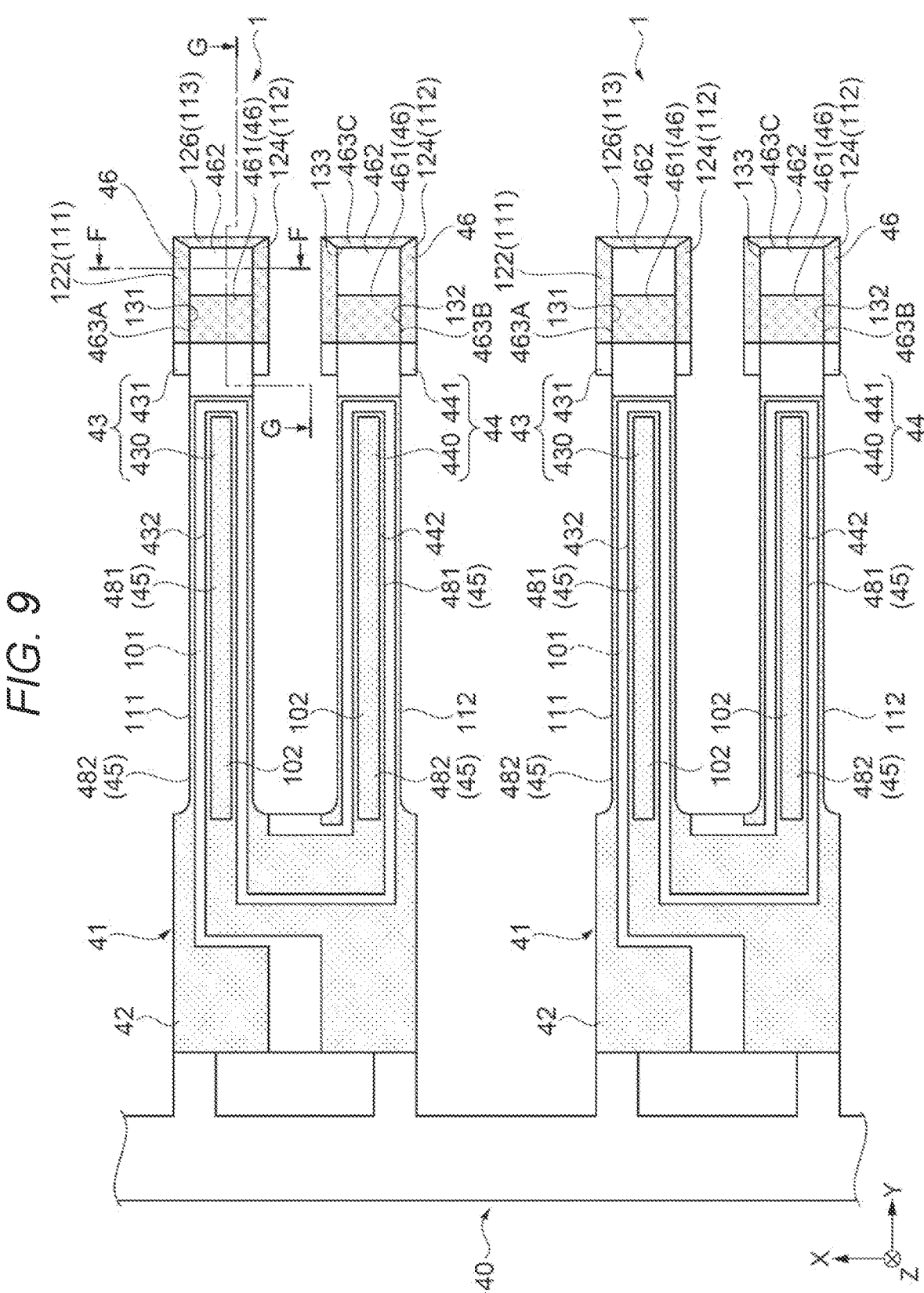
FIG. 9 is a plan view showing the vibrator elements according to Embodiment 1.
Figure 10:
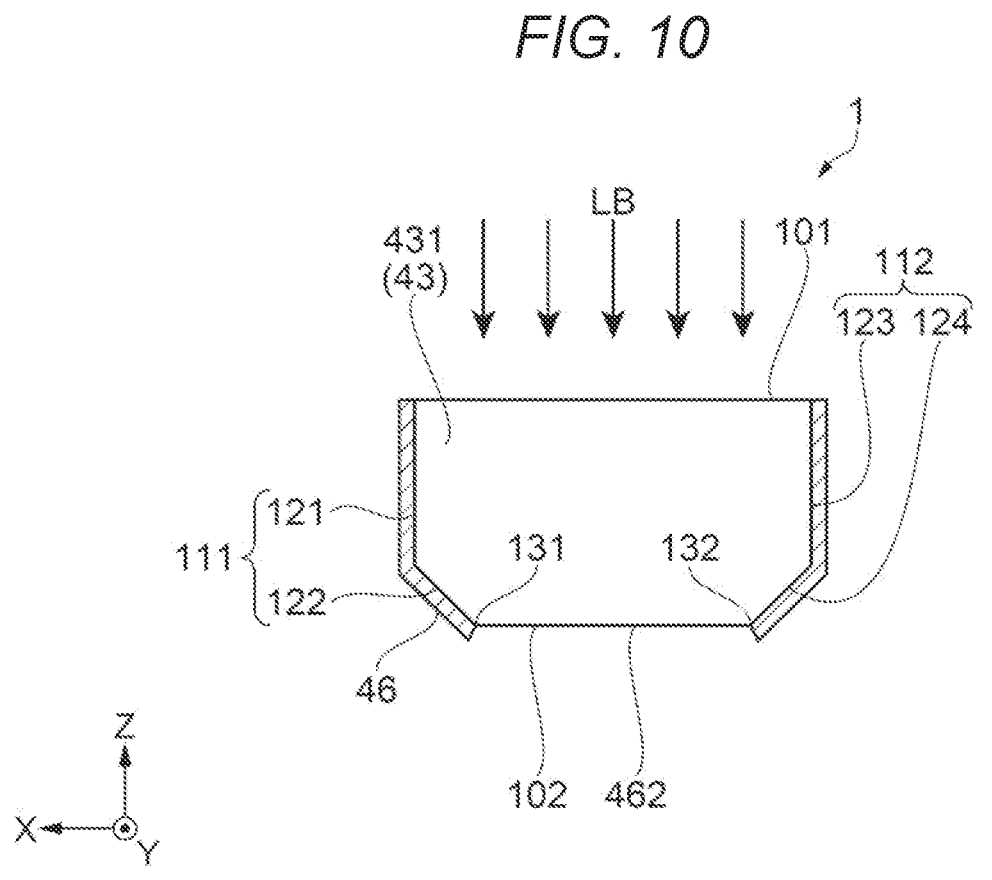
Figure 11:
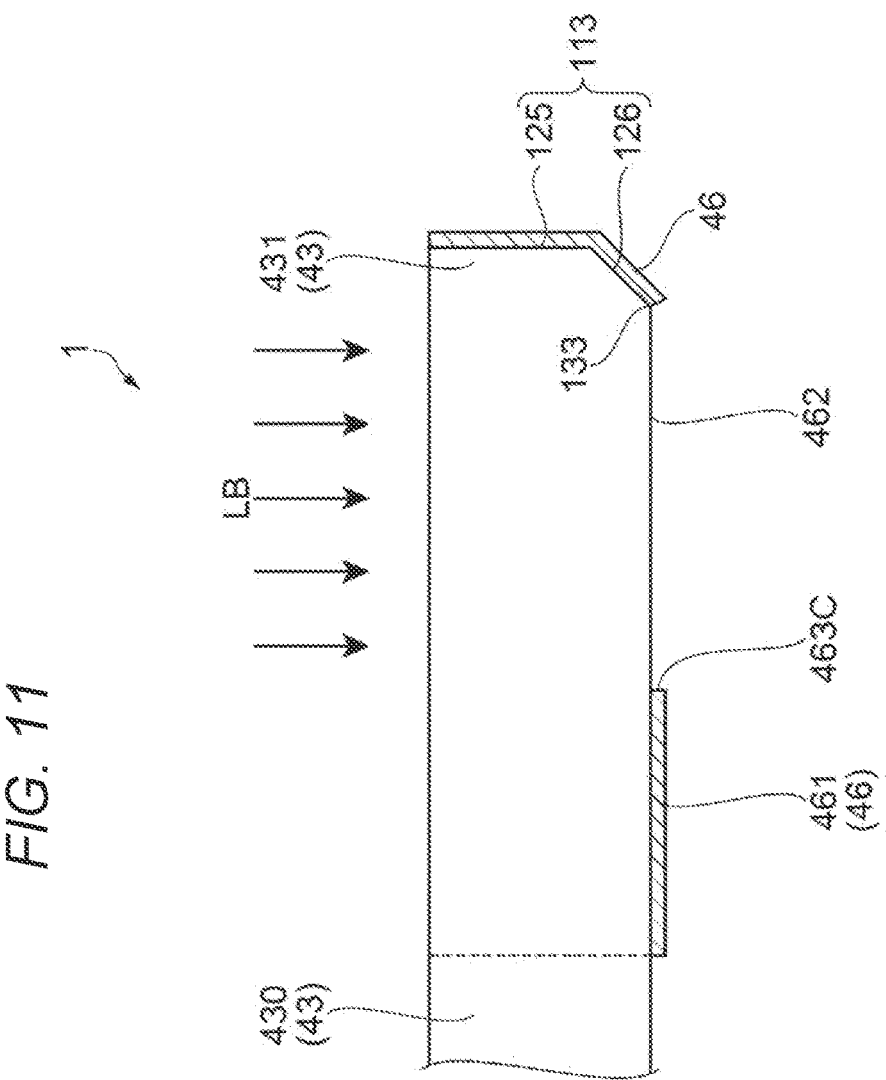
FIG. 11 is a cross-sectional view along the line G-G in FIG. 9.
Figure 11:
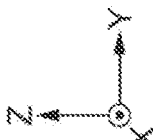

Then, in the step S3, the frequency of the vibrator element 1 is adjusted based on the oscillation frequency measured in the step S2. Specifically, as shown in FIG. 9 through FIG. 11, the first weights 461 arranged on the second surfaces 102 of the weight parts 431, 441 are irradiated with the laser beam LB to remove a part of each of the first weights 461. In the present embodiment, the irradiation with the laser beam LB is performed in a direction along the Z direction from the first surface 101 side of the vibrator element 1 toward the second surface 102. By removing a part of each of the first weights 461 to reduce the mass of each of the vibrating arms 43, 44, it is possible to vary the oscillation frequency of the vibrator element 1 to adjust the oscillation frequency to the frequency as the target value. It should be noted that since the weight part 431 of the vibrating arm 43 and the weight part 441 of the vibrating arm 44 are the same in basic configuration as each other, in FIG. 10 and FIG. 11, there is illustrated the weight part 431 of the vibrating arm 43 out of the weight parts 431, 441 of the vibrating arms 43, 44.

As shown in FIG. 10, when viewed from the Z direction as a direction in which the irradiation with the laser beam LB is performed, the laser beam LB with which a position at the inner side of the innermost parts 131 in the lower side surface part 122 as the first side surface part and the upper side surface part 121 as the second side surface part in the first side surface 111, or a position the same as the innermost parts 131 is irradiated is prevented from being refracted or blocked by the first side surface 111. In other words, when viewed from the Z direction, when removing the first weight 461 arranged at the position at the inner side of the innermost parts 131 in the first side surface part and the second side surface part of the first side surface 111, or at the position the same as the innermost parts 131, it is possible to sufficiently irradiate the first weight 461 arranged at the position at the inner side of the innermost parts 131 or the position the same as the innermost parts 131 with the laser beam LB. Therefore, since the foreign particle such as a burr is prevented from being formed when removing the first weight 461, it is possible to provide the vibrator element 1 in which the variation in frequency due to the drop of the foreign particle such as a burr is difficult to occur.

Further, similarly, when viewed from the Z direction, since the laser beam LB with which a position at the inner side of the innermost parts 132 in the lower side surface part 124 as the first side surface part and the upper side surface part 123 as the second side surface part in the second side surface 112, or a position the same as the innermost parts 132 is irradiated is prevented from being refracted or blocked by the second side surface 112, it is possible to sufficiently irradiate the first weight 461 arranged at the position at the inner side of the innermost parts 132 or a position the same as the innermost parts 132 with the laser beam LB. Therefore, since the foreign particle such as a burr is prevented from being formed when removing the first weight 461, it is possible to provide the vibrator element 1 in which the variation in frequency is difficult to occur.

Further, as shown in FIG. 11, when viewed from the Z direction, since the laser beam LB with which a position at the inner side of the innermost parts 133 in the lower side surface part 126 as the first side surface part and the upper side surface part 125 as the second side surface part in the third side surface 113, or a position the same as the innermost parts 133 is irradiated is prevented from being refracted or blocked by the third side surface 113, it is possible to sufficiently irradiate the first weight 461 arranged at the position at the inner side of the innermost parts 133 or a position the same as the innermost parts 133 with the laser beam LB. Therefore, since the foreign particle such as a burr is prevented from being formed when removing the first weight 461, it is possible to provide the vibrator element 1 in which the variation in frequency is difficult to occur.

It should be noted that in the present embodiment, the frequency adjustment process is performed after the frequency measurement process in the step S2, but this is not a limitation, and it is possible to adjust the oscillation frequency of the vibrator element 1 while performing the frequency measurement in the frequency adjustment process.

Further, the laser beam LB used in the frequency adjustment process is not particularly limited, but there can be used a pulsed laser beam such as YAG or excimer laser, or a continuous oscillation laser beam such as carbon dioxide laser beam. It should be noted that in the present embodiment, the pulsed laser beam is used as the laser beam LB. Specifically, by continuously performing the irradiation with the laser beam LB converged like a spot, a part of the first weight 461 is removed. By using the pulsed laser beam as the laser beam LB in such a manner to thereby change the irradiation time or the irradiation pitch while keeping the intensity of the laser beam LB without changing the intensity, it is possible to control the irradiation amount, namely an amount of energy, per unit area of the laser beam LB to the first weights 461. Therefore, the laser beam LB stabilizes, and it is possible to accurately perform the frequency adjustment process.

It should be noted that in the present embodiment, the first weights 461 are partially removed in the frequency adjustment process, but it is possible to entirely remove the first weights 461. In other words, by removing at least a part of the first weights 461, it is possible to change the oscillation frequency of the vibrator element 1 to adjust the frequency of the vibrator element 1 to the frequency as the target value.

As described hereinabove, according to the present embodiment, the following advantages can be obtained.

The vibrator element 1 has the base part 42, the vibrating arms 43, 44 each including the first surface 101, the second surface 102 located at the opposite side to the first surface 101 in the Z direction, the first side surface 111, the second side surface 112 located at the opposite side to the first side surface 111 in the X direction, and the third side surface 113 located at the opposite side to the base part 42, and extending in the Y direction from the base part 42, and the first weights 461 arranged on the second surfaces 102. Further, at least one of the first side surface 111, the second side surface 112, and the third side surface 113 includes the lower side surface parts 122, 124, or 126 as the first side surface part tilted with respect to the Z direction, and the upper side surface parts 121, 123, or 125 as the second side surface part tilted toward the first surface 101 with respect to the first side surface part. Further, the outer edge parts 463A, 463B, and 463C of the first weight 461 are located at the inner side of the innermost parts 131, 132, and 133 in the lower side surface parts 122, 124, and 126 as the first side surface part and the upper side surface parts 121, 123, and 125 as the second side surface part, or at the same positions as those of the innermost parts 131, 132, and 133 in the first side surface 111, the second side surface 112, and the third side surface 113, respectively, when viewed from the Z direction.

Thus, it is possible to sufficiently irradiate the first weight 461 with the laser beam LB, and thus the foreign particle such as a burr is prevented from being formed in the first weight 461, and it is possible to provide the vibrator element 1 in which the variation in frequency due to the drop of the foreign particle such as a burr is difficult to occur.

It should be noted that the upper side surface parts 121, 123, and 125 as the second side surface part in the first side surface 111, the second side surface 112, and the third side surface 113 of each of the weight parts 431, 441 are parallel to the Z direction in the present embodiment, but can be tilted with respect to the Z direction.

Further, the lower side surface parts 122, 124, and 126 as the first side surface part in the first side surface 111, the second side surface 112, and the third side surface 113 of each of the weight parts 431, 441 are tilted toward the inside of the weight parts 431, 441 from the first surface 101 toward the second surface 102, but can be tilted toward the outside of the weight parts 431, 441.

Further, in the present embodiment, the lower side surface parts 122, 124, and 126 in the first side surface 111, the second side surface 112, and the third side surface 113 of each of the weight parts 431, 441 are the first side surface part in the present disclosure, and the upper side surface parts 121, 123, and 125 are the second side surface part in the present disclosure, but it is possible to arrange the upper side surface parts 121, 123, and 125 and the lower side surface parts 122, 124, and 126 so that the upper side surface parts 121, 123, and 125 become the first side surface part, and the lower side surface parts 122, 124, and 126 become the second side surface part. It should be noted that when there is adopted the arrangement in which the lower side surface parts 122, 124, and 126 become the second side surface part, the lower side surface parts 122, 124, and 126 as the second side surface part are tilted toward the second surface 102 with respect to the upper side surface parts 121, 123, and 125 as the first side surface part.

Further, the upper end parts of the upper side surface parts 121, 123, and 125 and the first surface 101 are coupled to each other in first side surface 111, the second side surface 112, and the third side surface 113 of each of the weight parts 431, 441, but the upper end parts of the upper side surface parts 121, 123, and 125 and the first surface 101 can be coupled to each other via other side surface parts. Similarly, it is possible for the lower end parts of the upper side surface parts 121, 123, and 125 and the upper end parts of the lower side surface parts 122, 124, and 126 to be coupled to each other via other side surface parts, and it is possible for the upper end parts of the lower side surface parts 122, 124, and 126 and the second surface 102 to be coupled to each other via other side surface parts.

2. Embodiment 2

Then, a vibrator element 1a according to Embodiment 2 will be described with reference to FIG. 12 through FIG. 15.

The vibrator element 1a according to Embodiment 2 is substantially the same as the vibrator element 1 according to Embodiment 1 except the point that the shapes of weight parts 431a, 441a of the vibrating arms 43, 44 are different from those in Embodiment 1.

It should be noted that constituents substantially the same as in Embodiment 1 described above are denoted by the same reference symbols, and the description thereof will be omitted. FIG. 12 through FIG. 15 show a state in which the frequency adjustment process has been completed, namely a part of the first weights 461 is irradiated with the laser beam LB and is removed. Further, since the weight part 431a of the vibrating arm 43 and the weight part 441a of the vibrating arm 44 are the same in basic configuration as each other, in FIG. 13 through FIG. 15, there is illustrated the weight part 431a of the vibrating arm 43 out of the weight parts 431a, 441a of the vibrating arms 43, 44.

Figure 12:
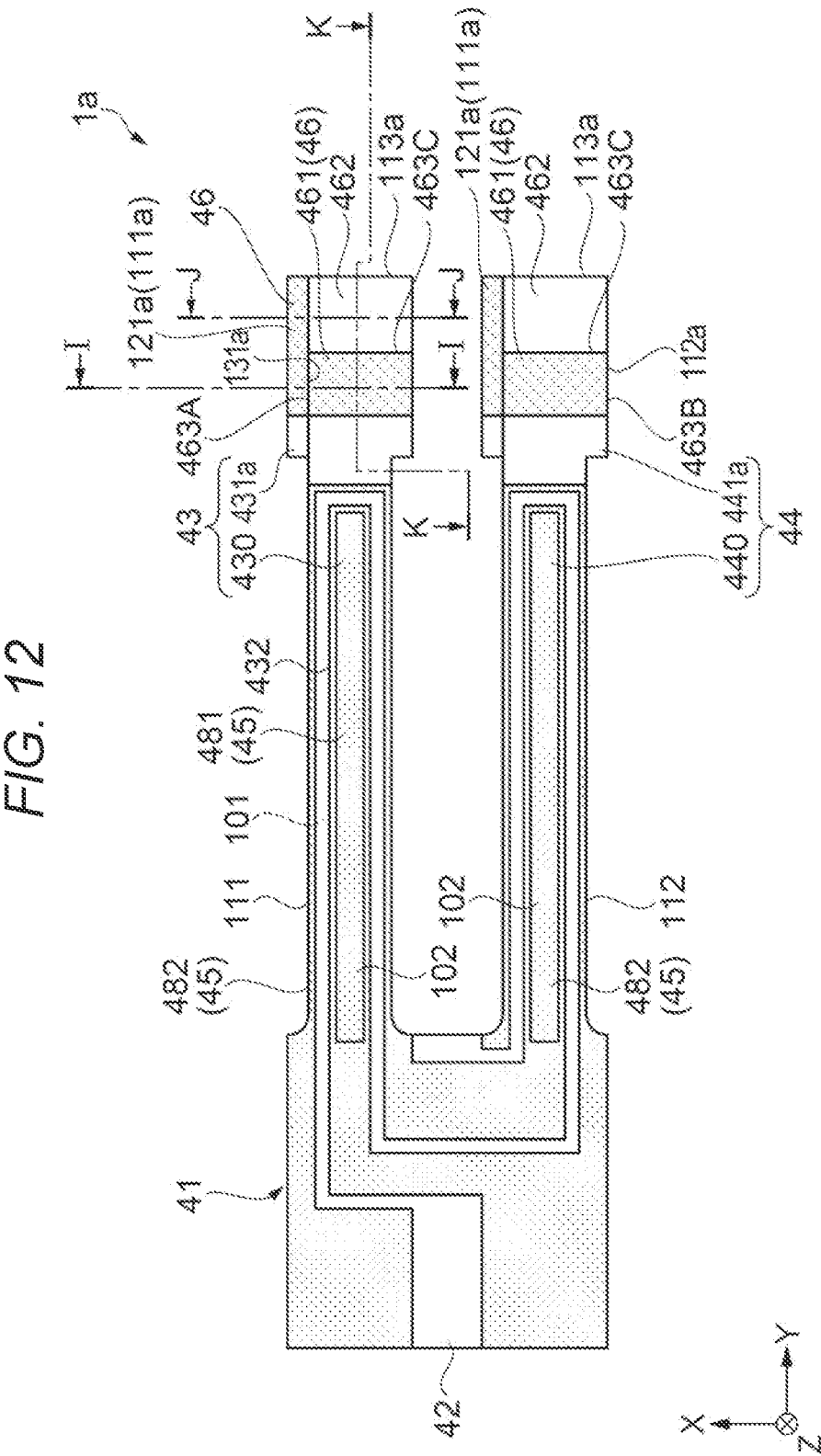
FIG. 12 is a plan view showing a vibrator element according to Embodiment 2.
Figure 13:
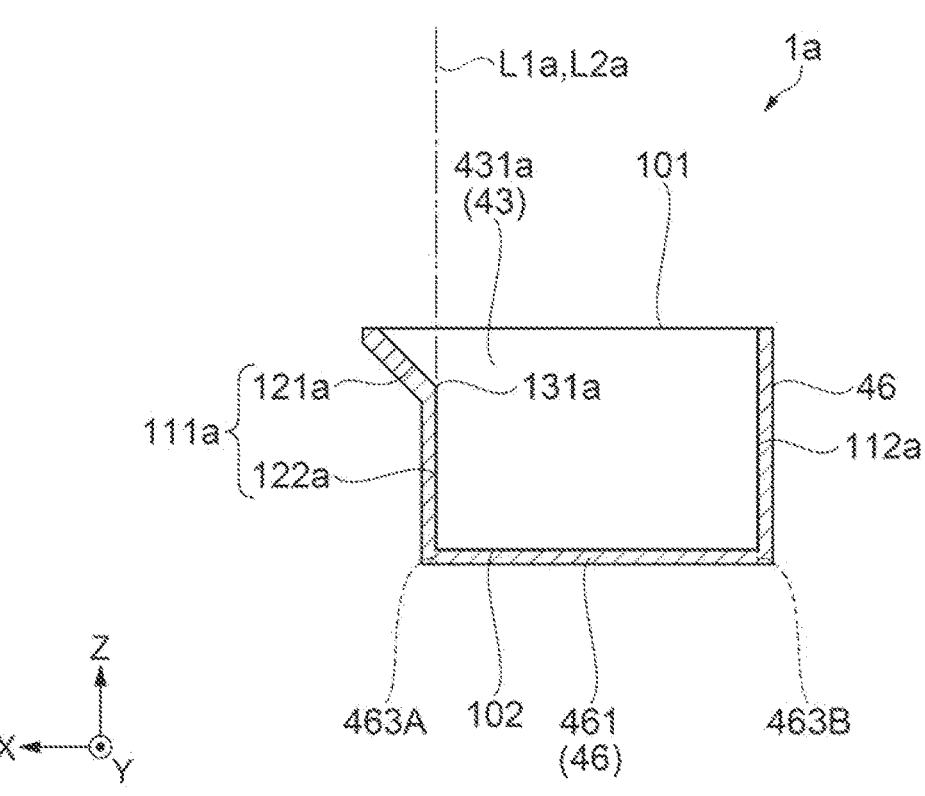
FIG. 13 is a cross-sectional view along the line I-I in FIG. 12.
Figure 14:
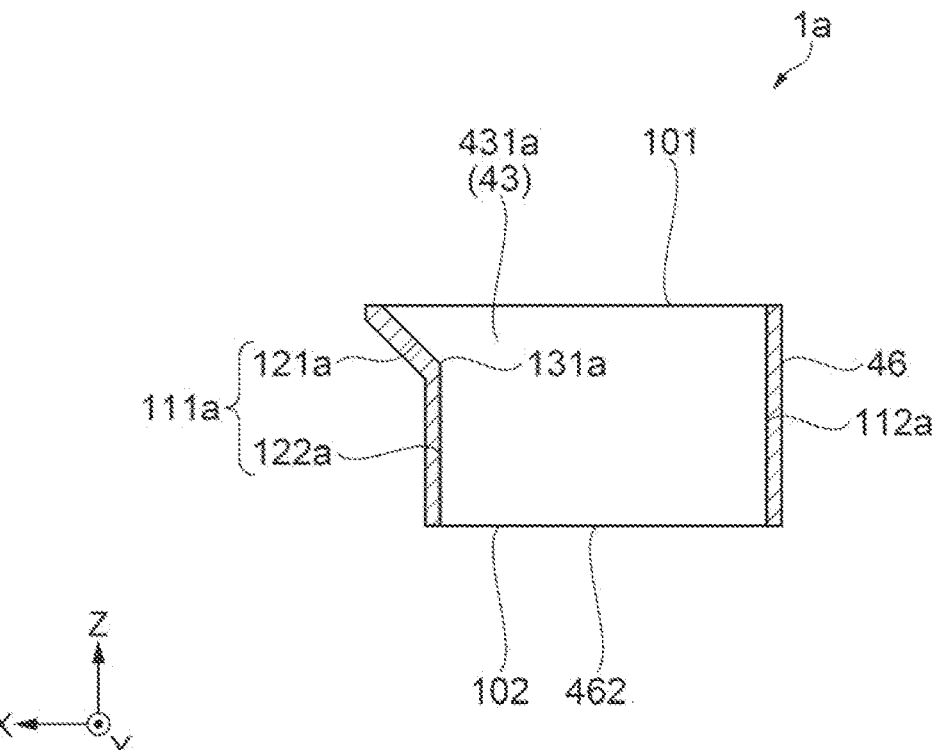
FIG. 14 is a cross-sectional view along the line J-J in FIG. 12.
Figure 15:
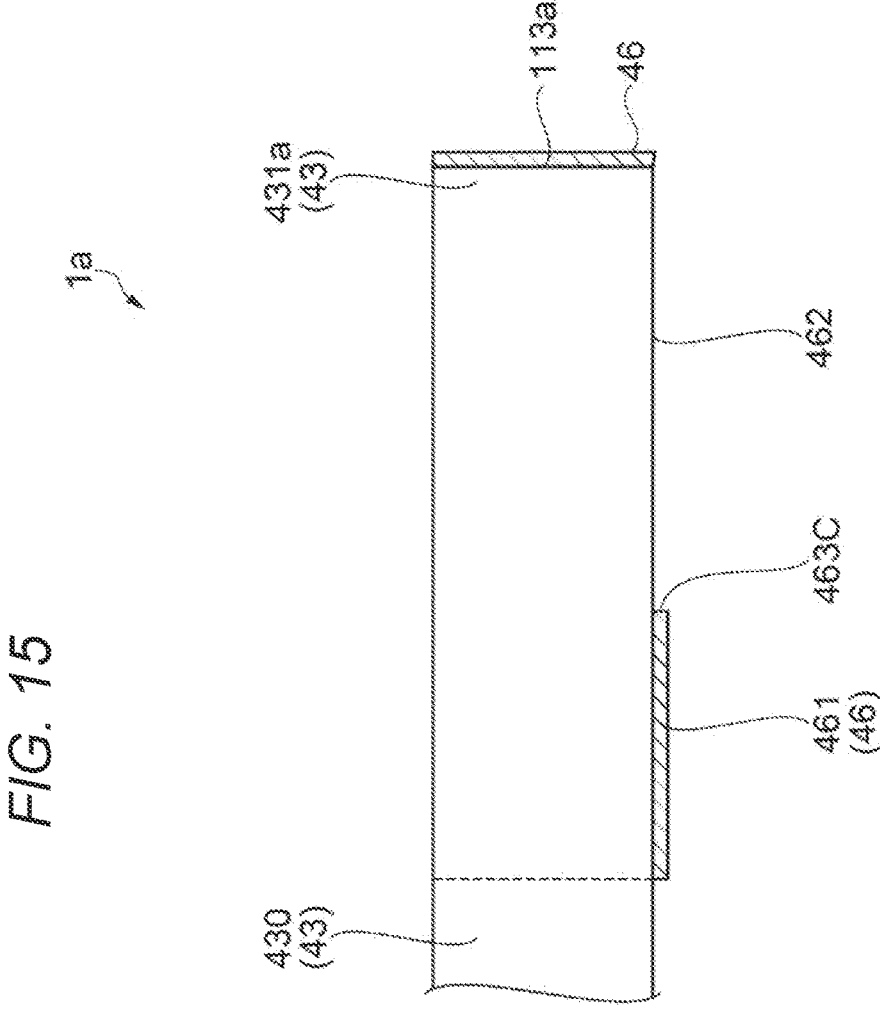
FIG. 15 is a cross-sectional view along the line K-K in FIG. 12.
Figure 15:

As shown in FIG. 12, FIG. 13, and FIG. 15, the metal films 46 are arranged on the second surfaces 102, first side surfaces 111a, second side surfaces 112a, and third side surfaces 113a in the weight parts 431a, 441a of the vibrating arms 43, 44, respectively. The metal film 46 arranged on the second surface 102 of the weight part 431a of the vibrating arm 43 is the first weight 461. Further, as shown in FIG. 12, FIG. 14, and FIG. 15, the removal areas 462 in the second surfaces 102 are areas which are irradiated with the laser beam LB, and from which the first weights 461 are removed in the frequency adjustment process.

The first side surface 111a in the weight part 431a of the vibrating arm 43 includes an upper side surface part 121a and a lower side surface part 122a. An upper end of the upper side surface part 121a in the first side surface 111a is coupled to the first surface 101. A lower end of the upper side surface part 121a in the first side surface 111a is coupled to an upper end of the lower side surface part 122a in the first side surface 111a. A lower end of the lower side surface part 122a in the first side surface 111a is coupled to the second surface 102.

In the present embodiment, the upper side surface part 121a of the first side surface 111a in the weight part 431a is tilted with respect to the Z direction, and the lower side surface part 122a of the first side surface 111a in the weight part 431a is parallel to the Z direction.

In other words, the upper side surface part 121a of the first side surface 111a in the weight part 431a is a first side surface part in the present disclosure tilted with respect to the Z direction. Further, the lower side surface part 122a of the first side surface 111a in the weight part 431a is a second side surface part in the present disclosure tilted toward the second surface 102 with respect to the first side surface part.

In other words, the first side surface 111a in the weight part 431a includes the upper side surface part 121a as the first side surface part tilted with respect to the Z direction, and the lower side surface part 122a as the second side surface part tilted toward the second surface 102 with respect to the upper side surface part 121a as the first side surface part.

In the present embodiment, the upper side surface part 121a of the first side surface 111a in the weight part 431a is tilted toward the inside of the weight part 431a from the first surface 101 toward the second surface 102. In other words, in the first side surface 111a of the weight part 431a, innermost parts 131a in the upper side surface part 121a as the first side surface part and the lower side surface part 122a as the second side surface part each become a lower end part of the upper side surface part 121a where the upper side surface part 121a is coupled to the lower side surface part 122a.

As shown in FIG. 13, in the first side surface 111a of the weight part 431a, assuming an imaginary line which passes the innermost parts 131a in the upper side surface part 121a as the first side surface part and the lower side surface part 122a as the second side surface part, and is parallel to the Z direction as an imaginary line L1a, and an imaginary line which passes the outer edge part 463A at the first side surface 111a side in the first weight 461 arranged on the second surface 102 of the weight part 431a, and is parallel to the Z direction as an imaginary line L2a, the imaginary line L1a and the imaginary line L2a are located at the same position in a side view from the Y direction perpendicular to the Z direction.

Further, as shown in FIG. 12, in the weight part 431a, the innermost parts 131a in the upper side surface part 121a as the first side surface part and the lower side surface part 122a as the second side surface part in the first side surface 111a, and the outer edge part 463A at the first side surface 111a side in the first weight 461 are located at the same position. In other words, the first weight 461 in the weight part 431a is arranged so that the outer edge part 463A at the first side surface 111a side in the first weight 461 is located at the same position as those of the innermost parts 131a in the upper side surface part 121a as the first side surface part and the lower side surface part 122a as the second side surface part in the first side surface 111a when viewed from the Z direction.

By arranging the first weight 461 so that the outer edge part 463A at the first side surface 111a side in the first weight 461 is located at the same position as those of the innermost parts 131a in the upper side surface part 121a as the first side surface part and the lower side surface part 122a as the second side surface part in the first side surface 111a when viewed from the Z direction as described above, it is possible to prevent the refraction or the blockage of the laser beam LB in the upper side surface part 121a and the lower side surface part 122a of the first side surface 111a when irradiating the first weight 461 with the laser beam LB. Therefore, it is possible to sufficiently irradiate the first weight 461 with the laser beam LB, and thus the foreign particle such as a burr is prevented from being formed, and therefore, it is possible to provide the vibrator element 1a in which the variation in frequency due to the drop of the foreign particle such as a burr is difficult to occur.

It should be noted that as shown in FIG. 13 and FIG. 14, in the present embodiment, the second side surface 112a in the weight part 431a of the vibrating arm 43 is a surface parallel to the Y-Z plane, and as shown in FIG. 15, the third side surface 113a is a surface parallel to the X-Z plane. In other words, the second side surface 112a and the third side surface 113a in the weight part 431a of the vibrating arm 43 do not include the first side surface part and the second side surface part in the present disclosure.

The weight part 431a of the vibrating arm 43 is described, and the weight part 431a of the vibrating arm 43 and the weight part 441a of the vibrating arm 44 are the same in basic configuration as each other, and similarly to the weight part 431a of the vibrating arm 43, the first side surface 111a in the weight part 441a of the vibrating arm 44 includes the upper side surface part 121a as the first side surface part tilted with respect the Z direction, and the lower side surface part 122a as the second side surface part tilted toward the second surface 102 with respect to the upper side surface part 121a as the first side surface part. Further, by arranging the first weight 461 so that the outer edge part 463A at the first side surface 111a side in the first weight 461 is located at the same position as those of the innermost parts 131a in the upper side surface part 121a as the first side surface part and the lower side surface part 122a as the second side surface part in the first side surface 111a when viewed from the Z direction, it is possible to sufficiently irradiate the first weight 461 with the laser beam LB, and thus it is possible to provide the vibrator element 1a in which the variation in frequency due to the drop of the foreign particle such as a burr is difficult to occur.

As described hereinabove, according to the present embodiment, it is possible to obtain substantially the same advantages as in Embodiment 1.

The first side surface 111a as at least one of the first surface 111a, the second side surface 112a, and the third side surface 113a in the vibrator element 1a includes the upper side surface part 121a as the first side surface part tilted with respect to the Z direction, and the lower side surface part 122a as the second side surface part tilted toward the second surface 102 with respect to the first side surface part. Further, the first weight 461 is arranged so that the outer edge part 463A at the first side surface 111a side in the first weight 461 is located at the same position as those of the innermost parts 131a in the upper side surface part 121a as the first side surface part and the lower side surface part 122a as the second side surface part when viewed from the Z direction.

Thus, it is possible to sufficiently irradiate the first weight 461 with the laser beam LB, and thus occurrence of the foreign particle such as a burr in the first weight 461 is prevented, and it is possible to provide the vibrator element 1a in which the variation in frequency is difficult to occur.

It should be noted that the lower side surface part 122a as the second side surface part in the first side surface 111a of each of the weight parts 431a, 441a is parallel to the Z direction in the present embodiment, but can be tilted with respect to the Z direction.

Further, the upper side surface part 121a as the first side surface part in the first side surface 111a of each of the weight parts 431a, 441a is tilted toward the inside of the weight parts 431a, 441a from the first surface 101 toward the second surface 102, but can be tilted toward the outside of the weight parts 431a, 441a.

3. Embodiment 3

Then, a vibrator element 1b according to Embodiment 3 will be described with reference to FIG. 16 through FIG. 18.

The vibrator element 1b according to Embodiment 3 is substantially the same as the vibrator element 1 according to Embodiment 1 except the point that the metal film 46 arranged on the lower side surface part 122 as the first side surface part in the first side surface 111 of each of the weight parts 431, 441 of the vibrating arms 43, becomes a second weight 465, and the point that the second weight 465 has a removal area 466 removed by the laser beam LB compared to the vibrator element 1 according to Embodiment 1.

It should be noted that constituents substantially the same as in Embodiment 1 described above are denoted by the same reference symbols, and the description thereof will be omitted. FIG. 16 through FIG. 18 show a state in which a frequency fine adjustment process described later has been completed, namely a part of the second weights 465 is irradiated with the laser beam LB and is removed. Further, since the weight part 431 of the vibrating arm 43 and the weight part 441 of the vibrating arm 44 are the same in basic configuration as each other, in FIG. 17 and FIG. 18, there is illustrated the weight part 431 of the vibrating arm 43 out of the weight parts 431, 441 of the vibrating arms 43, 44.

Figure 16:
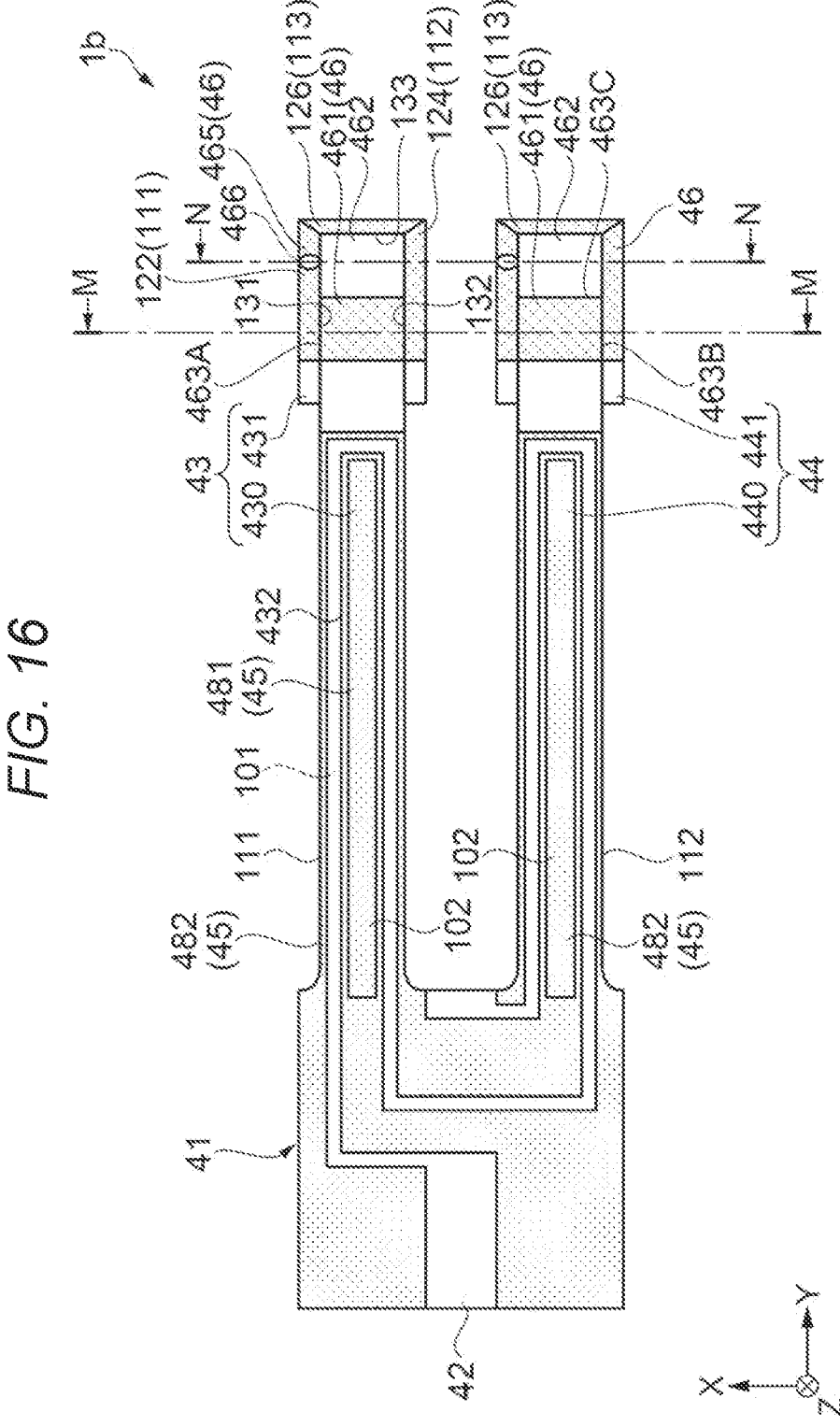
FIG. 16 is a plan view showing a vibrator element according to Embodiment 3.
Figure 17:
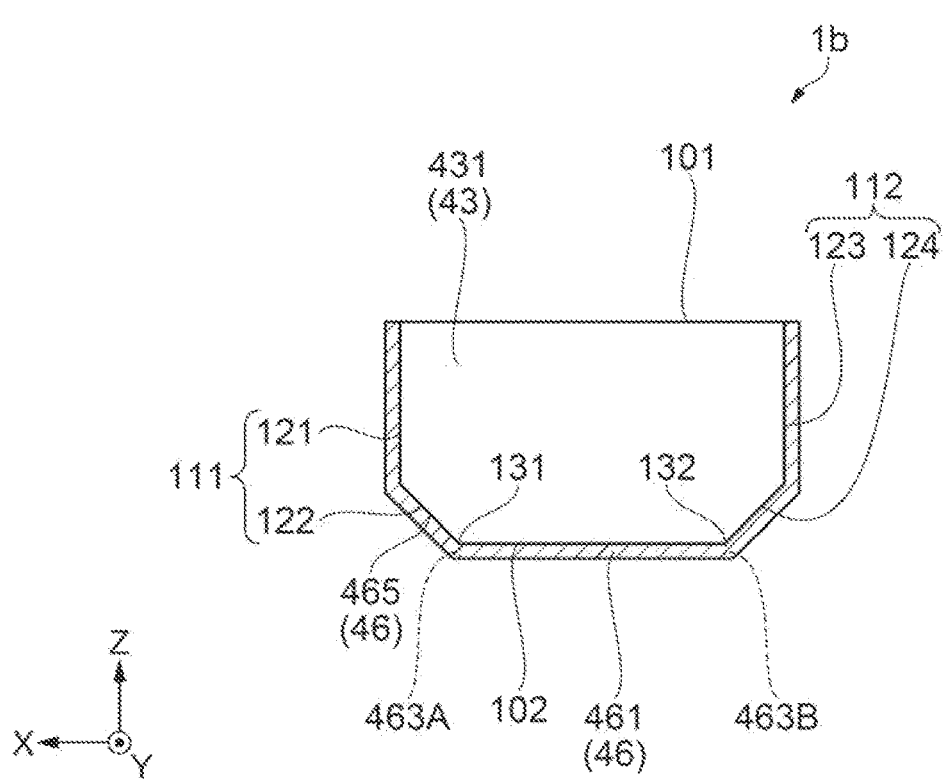
FIG. 17 is a cross-sectional view along the line M-M in FIG. 16.

As shown in FIG. 16 and FIG. 17, the metal films 46 are arranged on the second surfaces 102, the first side surfaces 111, the second side surfaces 112, and the third side surfaces 113 in the weight parts 431, 441 of the vibrating arms 43, 44, respectively.

In the present embodiment, the metal film 46 arranged on the lower side surface part 122 as the first side surface part in the first side surface 111 of each of the weight parts 431, 441 is the second weight 465. In other words, the second weight 465 is arranged on the lower side surface part 122 as the first side surface part in the first side surface 111 of each of the weight parts 431, 441.

Figure 18:
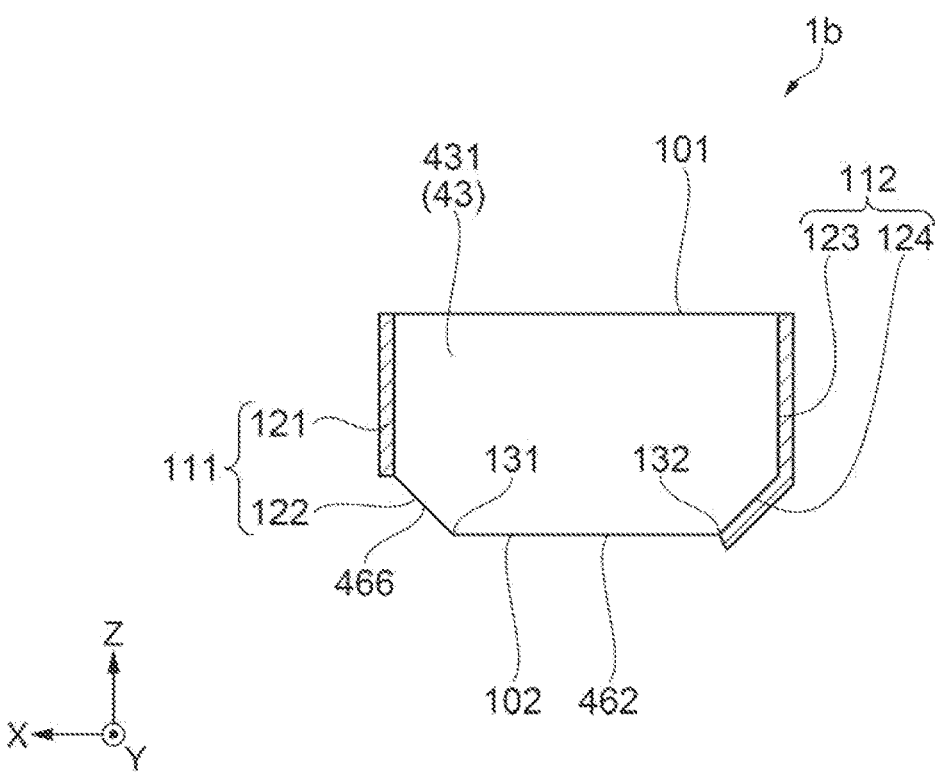
FIG. 18 is a cross-sectional view along the line N-N in FIG. 16.

Further, as shown in FIG. 16 and FIG. 18, the lower side surface part 122 in the first side surface 111 has the removal area 466. The removal area 466 is an area which is irradiated with the laser beam LB, and from which the second weight 465 is removed in the frequency fine adjustment process described later.

Figure 19:
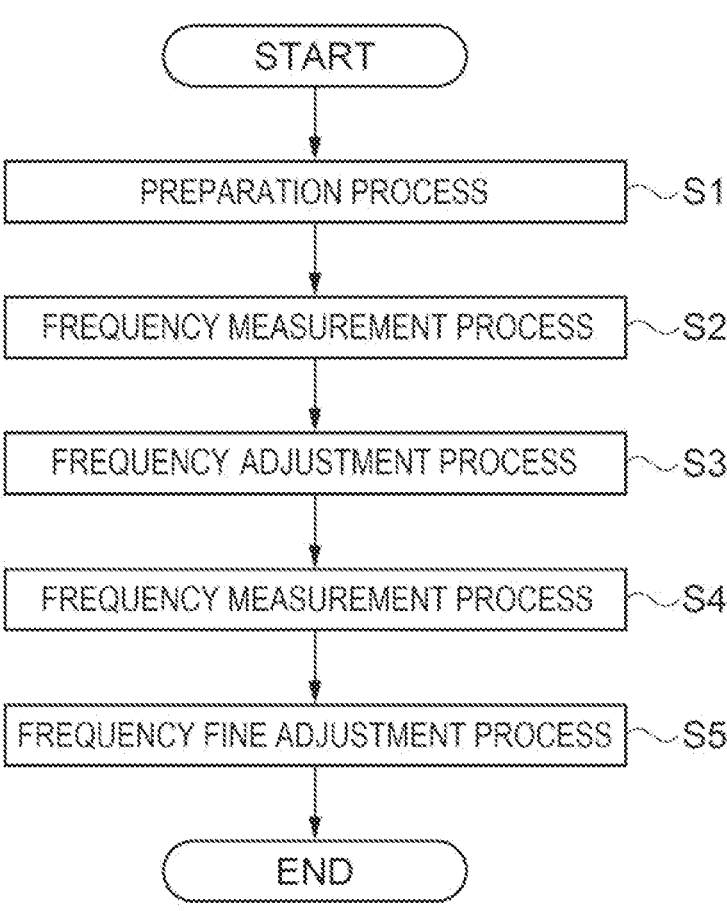
FIG. 19 is a flowchart showing a method of manufacturing the vibrator element according to Embodiment 3.
Figure 20:
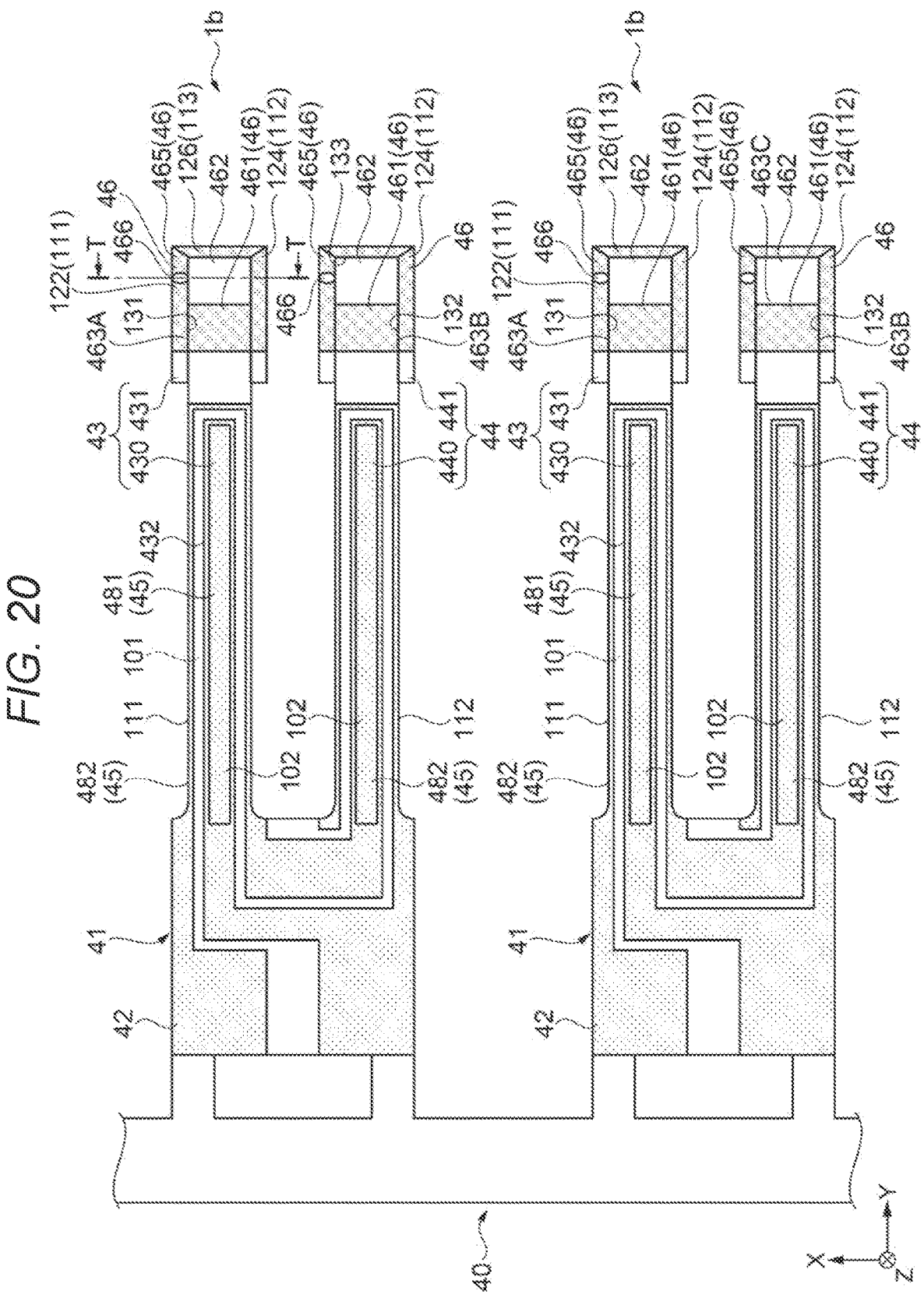
FIG. 20 is a plan view showing the vibrator elements according to Embodiment 3.
Figure 21:
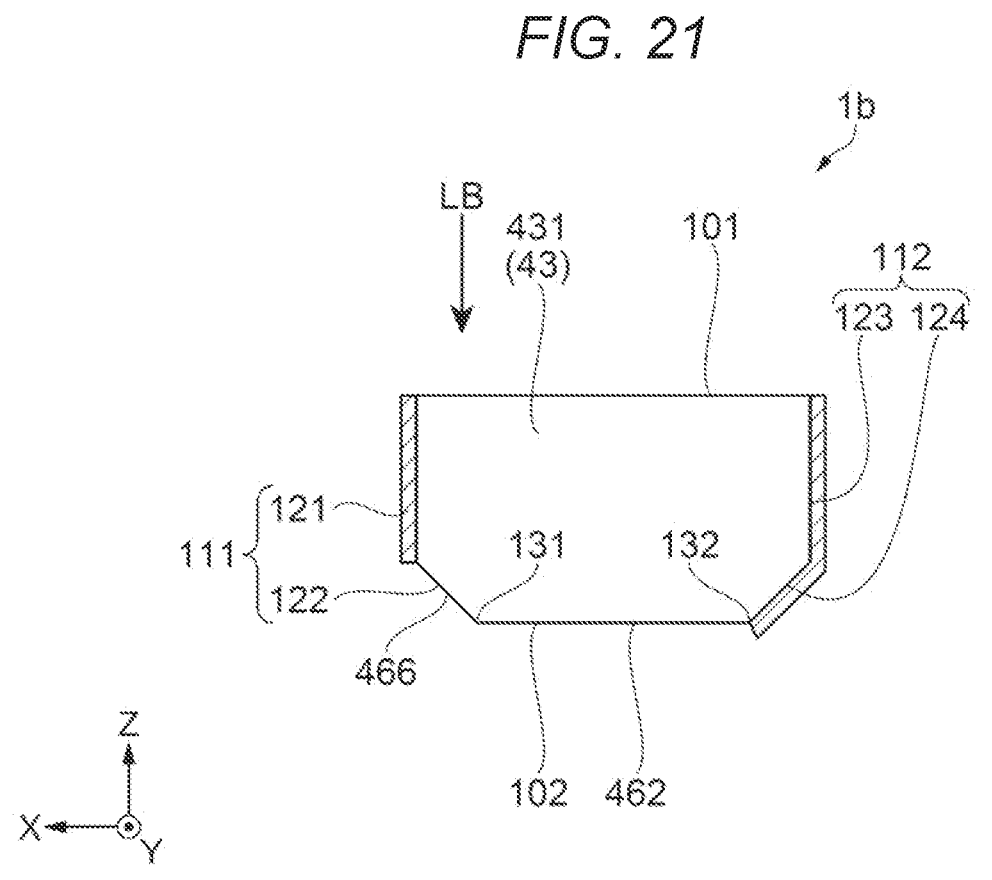

Then, a method of manufacturing the vibrator element 1b according to Embodiment 3 will be described with reference to FIG. 19 through FIG. 21. The method of manufacturing the vibrator element 1b according to Embodiment 3 is substantially the same as Embodiment 1 except the point that a frequency measurement process as the step S4 and a frequency fine adjustment process as the step S5 are provided compared to the method of manufacturing the vibrator element 1 according to Embodiment 1.

It should be noted that constituents substantially the same as in Embodiment 1 described above are denoted by the same reference symbols, and the description thereof will be omitted. Further, since the weight part 431 of the vibrating arm 43 and the weight part 441 of the vibrating arm 44 are the same in basic configuration as each other, in FIG. 21, there is illustrated the weight part 431 of the vibrating arm 43 out of the weight parts 431, 441 of the vibrating arms 43, 44.

The method of manufacturing the vibrator element 1*b* includes the frequency adjustment method of adjusting the frequency of the vibrator element 1*b*. Further, as shown in FIG. 19, the frequency adjustment method of adjusting the frequency of the vibrator element 1*b* includes the preparation process of preparing the vibrator element 1*b*, the frequency measurement process of measuring the oscillation frequency of the vibrator element 1*b*, and the frequency adjustment process of adjusting the oscillation frequency of the vibrator element 1*b*, the frequency measurement process of measuring the oscillation frequency of the vibrator element 1*b*, and the frequency fine adjustment process of changing the oscillation frequency of the vibrator element 1*b* to finely adjust the oscillation frequency of the vibrator element 1*b* to a frequency as a target value.

Since the preparation process as the step S1, the frequency measurement process as the step S2, and the frequency adjustment process as the step S3 are processes the same as in Embodiment 1, the detailed description will be omitted.

1.1 Preparation Process

First, in the step S1, the quartz crystal wafer 40 is prepared, and the plurality of vibrating bodies 41 is provided to the quartz crystal wafer 40. Subsequently, the electrodes 45 and the metal films 46 are formed on the surfaces of the vibrating bodies 41. In the present embodiment, as described above, the metal film 46 formed on the second surface 102 of each of the weight parts 431, 441 is the first weight 461, and the metal film 46 formed on the lower side surface part 122 as the first side surface part in the first side surface 111 of each of the weight parts 431, 441 is the second weight 465.

1.2 Frequency Measurement Process

Then, in the step S2, the oscillation frequency of the vibrator element 1*b* is measured.

1.3 Frequency Adjustment Process

Then, in the step S3, the frequency of the vibrator element 1*b* is adjusted based on the oscillation frequency measured in the step S2. Specifically, the first weights 461 arranged on the second surfaces 102 of the weight parts 431, 441 are irradiated with the laser beam LB to remove a part of each of the first weights 461.

1.4 Frequency Measurement Process

Then, in the step S4, a probe of the frequency measurement device having an oscillation circuit is made to have contact with the electrode 45 formed on the surface of the vibrating body 41 to measure the oscillation frequency of the vibrator element 1*b* similarly to the step S2.

1.5 Frequency Fine Adjustment Process

Then, in the step S5, the frequency of the vibrator element 1*b* is fine adjusted based on the oscillation frequency measured in the step S4. Specifically, as shown in FIG. 20 and FIG. 21, the second weights 465 arranged on the lower side surface parts 122 as the first side surface part in the first side surfaces 111 of the weight parts 431, 441 are irradiated with the laser beam LB to remove a part of each of the second weights 465.

In the present embodiment, the irradiation with the laser beam LB is performed in a direction along the Z direction from the first surface 101 side of the vibrator element 1 toward the second surface 102. The position of the focus of the laser beam LB is located at the position of the first weight 461 arranged on the second surface 102 so that the first weight 461 arranged on the second surface 102 can efficiently be removed in the frequency adjustment process as the step S3. Specifically, the position of the second weight 465 arranged on the lower side surface part 122 as the first side surface part in the first side surface 111 of each of the weight parts 431, 441, and the position of the focus of the laser beam LB with which the second weight 465 is irradiated do not coincide with each other. Therefore, an amount of the irradiation with the laser beam LB per unit area with which the second weight 465 is irradiated, namely an amount of energy, decreases from the amount of energy of the laser beam LB per unit area with which the first weight 461 is irradiated, and an amount of removal of the second weight 465 per spot of the laser beam LB decreases compared to the amount of removal of the first weight 461 per spot of the laser beam LB.

Therefore, by removing a part of the second weight 465 in the frequency fine adjustment process as the step S5, it is possible to more accurately change the oscillation frequency of the vibrator element 1*b* than in the frequency adjustment process as the step S3, and thus, it is possible to fine adjust the oscillation frequency of the vibrator element 1*b* to the frequency as the target value.

It should be noted that in the present embodiment, the frequency fine adjustment process is performed after the frequency measurement process in the step S4, but this is not a limitation, and it is possible to fine adjust the oscillation frequency of the vibrator element 1*b* while performing frequency measurement in the frequency fine adjustment process.

Further, in the present embodiment, the metal film 46 formed on the lower side surface part 122 as the first side surface part in the first side surface 111 of each of the weight parts 431, 441 is used as the second weight 465, but it is possible to use the metal film 46 formed on the lower side surface part 124 as the first side surface part in the second side surface 112, or the metal film 46 formed on the lower side surface part 126 as the first side surface part in the third side surface 113 as the second weight 465.

As described above, according to the present embodiment, the following advantages can be obtained in addition to the advantages in Embodiment 1.

In the vibrator element 1*b*, the second weight 465 is arranged on the lower side surface part 122 as the first side surface part in the first side surface 111 of each of the weight parts 431, 441. Thus, it is possible to provide the vibrator element 1*b* the frequency of which is easy to fine adjust.

It should be noted that in the present embodiment, the second weights 465 are partially removed in the frequency fine adjustment process described above, but it is possible to entirely remove the second weights 465. In other words, by removing at least a part of the second weights 465, it is possible to change the oscillation frequency of the vibrator element 1*b* to adjust the frequency of the vibrator element 1*b* to the frequency as the target value.

4. Embodiment 4

Then, a vibrator device 10 according to Embodiment 4 will be described with reference to FIG. 22. In the vibrator device 10 according to Embodiment 4, it is possible to use any one of the vibrator elements 1, 1*a*, and 1*b* described above. In the present embodiment, there will be described an example of applying the vibrator element 1 described in Embodiment 1.

It should be noted that constituents substantially the same as in Embodiment 1 described above are denoted by the same reference symbols, and the description thereof will be omitted. Further, in FIG. 22, the illustration of the electrodes 45 and the metal films 46 provided to the vibrator element 1 is omitted.

Figure 22:
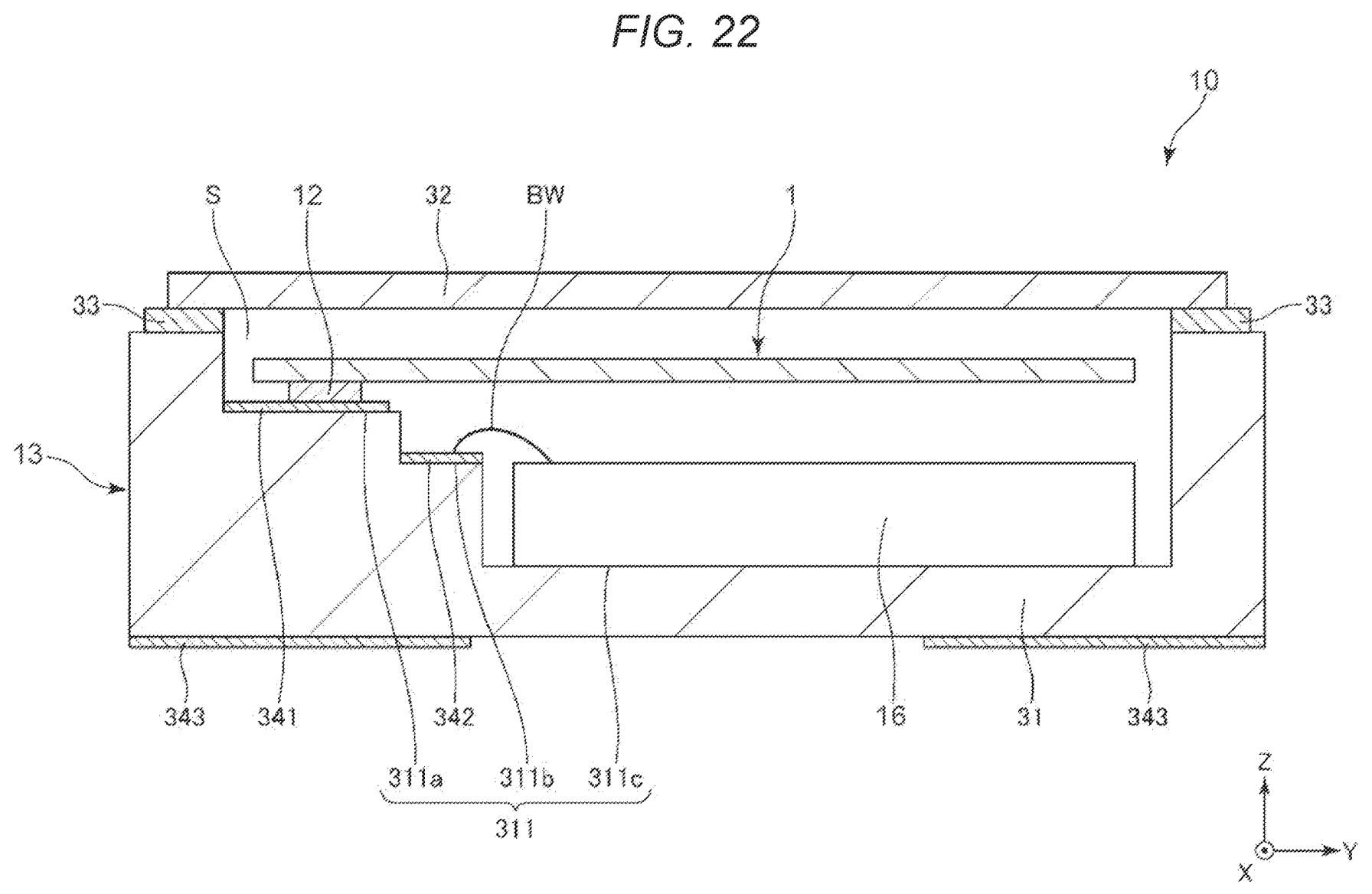

The vibrator device 10 shown in FIG. 22 is used as, for example, an oscillator. It should be noted that the vibrator device 10 can be used as other equipment than the oscillator, for example, a variety of sensors such as an acceleration sensor and an angular velocity sensor. The vibrator device 10 can be incorporated in a computer, a printer, a smartphone, a tablet terminal, a timepiece, a television set, a heat-mounted display, a video camera, a digital still camera, a car navigation system, computerized game equipment, a variety of medical instruments, a variety of measurement instruments, a variety of mobile objects, and so on.

As shown in FIG. 22, the vibrator device 10 has a package 13 and the vibrator element 1 and a circuit element 16 housed in the package 13.

The package 13 has a base 31 provided with a recessed part 311 opening on an upper surface, and a lid 32 which has a plate-like shape and is bonded to the upper surface of the base 31 via a bonding member 33 so as to close the opening of the recessed part 311. The recessed part 311 forms an internal space S inside the package 13, and the vibrator element 1 and the circuit element 16 are housed in the internal space S.

For example, the base 31 can be formed of ceramics such as alumina, and the lid 32 can be formed of a metal material such as Kovar. It should be noted that the constituent materials of the base 31 and the lid 32 are not particularly limited. For example, the lid 32 can be formed of a glass material having a light transmissive property.

Further, the internal space S is airtightly sealed, and is set in a reduced-pressure state, and is preferably set in a state more approximate to a vacuum state. Thus, the viscosity resistance reduces and the vibration characteristics of the vibrator element 1 are improved. It should be noted that the atmosphere in the internal space S is not particularly limited, and can be an atmosphere filled with an inert gas such as nitrogen or argon, or can also be in the atmospheric pressure state or a pressurized state instead of the reduced-pressure state.

Further, the recessed part 311 has a recessed part 311a, a recessed part 311b, and a recessed part 311c wherein the recessed part 311a opens on the upper surface of the base 31, the recessed part 311b opens on a bottom surface of the recessed part 311a and is smaller in opening width than the recessed part 311a, and the recessed part 311c opens on a bottom surface of the recessed part 311b and is smaller in opening width than the recessed part 311b.

On the bottom surface of the recessed part 311a, there is arranged a plurality of internal terminals 341. On the bottom surface of the recessed part 311b, there is arranged a plurality of internal terminals 342. On the lower surface of the base 31, there is arranged a plurality of external terminals 343. Some of the internal terminals 342 are electrically coupled to the internal terminals 341 via internal interconnections not shown formed inside the base 31, and the rest of the internal terminals 342 are electrically coupled to the external terminals 343 via internal interconnections not shown.

The vibrator element 1 is bonded to the internal terminals 341 via bonding members 12 having electrical conductivity in the base part 42 of the vibrator element 1. Thus, the vibrator element 1 is fixed to the base 31 via the bonding members 12, and at the same time, the electrodes 45 provided to the vibrator element 1 and the internal terminals 341 are electrically coupled to each other.

The circuit element 16 is bonded to the bottom surface of the recessed part 311c. The circuit element 16 includes, for example, an interface section for performing communication with an external host device, and an oscillation circuit for oscillating the vibrator element 1. It should be noted that the circuit element 16 can be omitted, or can also be disposed outside the package 13.

Further, the circuit element 16 is electrically coupled to the internal terminals 342 via bonding wires BW.

As described above, since the vibrator element 1 and the circuit element 16 are electrically coupled to each other via the internal terminals 341, the internal interconnections not shown, the internal terminals 342, and the bonding wires BW, by the circuit element 16 applying the drive signal to the vibrator element 1, it is possible to oscillate the vibrator element 1 with a desired frequency.

As described hereinabove, according to the present embodiment, it is possible to obtain substantially the same advantages as in Embodiment 1 described above, and thus, it is possible to provide the vibrator device 10 in which a variation in frequency is difficult to occur.

5. Embodiment 5

Then, a vibrator element 1c according to Embodiment 5 will be described with reference to FIG. 23 through FIG. 25.

The vibrator element 1c according to Embodiment 5 is substantially the same as in Embodiment 1 except the point that the vibrator element 1c is a gyro element having a structure called a so-called double T type compared to the vibrator element 1 according to Embodiment 1.

It should be noted that constituents substantially the same as in Embodiment 1 described above are denoted by the same reference symbols, and the description thereof will be omitted. Further, FIG. 23 shows a state in which the frequency adjustment process described above has been completed, namely a part of the first weights 461 is irradiated with the laser beam LB and is removed.

The vibrator element 1c according to the present embodiment is a gyro element, and specifically, an angular velocity sensor element capable of detecting angular velocity ωz defining the Z axis as a detection axis.

Figure 23:
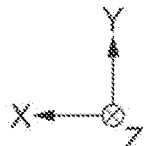
FIG. 23 is a plan view showing a vibrator element according to Embodiment 5.

As shown in FIG. 23, the vibrator element 1c has a vibrating body 41c, the electrodes 45, and the metal films 46 for adjusting the frequency of the vibrating body 41c. In the present embodiment, as described later, the electrodes 45 are used for vibrating drive arms 456, 457, 458, and 459 provided to the vibrating body 41c, and for detecting vibrations of detection arms 452, 453 provided to the vibrating body 41c.

The vibrating body 41c has a base part 451 which is formed of a Z-cut quartz crystal plate, and is located in a central portion, a pair of detection arms 452, 453 as vibrating arms respectively extending from the base part 451 toward the positive side in the Y direction and the negative side in the Y direction, a pair of coupling arms 454, 455 respectively extending from the base part 451 toward the positive side in the X direction and the negative side in the X direction, a pair of drive arms 456, 457 as vibrating arms respectively extending from a tip portion of the coupling arm 454 toward the positive side in the Y direction and the negative side in the Y direction, and a pair of drive arms 458, 459 as vibrating arms respectively extending from a tip portion of the coupling arm 455 toward the positive side in the Y direction and the negative side in the Y direction.

It should be noted that in the present embodiment, a side surface at the positive side in the X direction of each of the detection arm 452, the drive arm 456, and the drive arm 458 extending toward the positive side in the Y direction is defined as the first side surface 111, and a side surface at the negative side in the X direction thereof is defined as the second side surface 112. A side surface at the positive side in the Y direction as a tip surface of each of the detection arm 452, the drive arm 456, and the drive arm 458 is defined as the third side surface 113.

Further, a side surface at the negative side in the X direction of each of the detection arm 453, the drive arm 457, and the drive arm 459 extending toward the negative side in the Y direction is defined as the first side surface 111, and a side surface at the positive side in the X direction thereof is defined as the second side surface 112. A side surface at the negative side in the Y direction as a tip surface of each of the detection arm 453, the drive arm 457, and the drive arm 459 is defined as the third side surface 113.

The pair of detection arms 452, 453 as the vibrating arms respectively have arm parts 452a, 453a, and weight parts 452b, 453b. The weight parts 452b, 453b are respectively disposed in the tip portions at the opposite side to the base part 451 in the detection arms 452, 453. The arm parts 452a, 453a are arranged at the base part 451 side of the weight parts 452b, 453b, and couple the weight parts 452b, 453b and the base part 451 to each other, respectively.

The pair of drive arms 456, 457 as the vibrating arms respectively have arm parts 456a, 457a, and weight parts 456b, 457b. The weight parts 456b, 457b are respectively disposed in the tip portions at the opposite side to the coupling arm 454 in the drive arms 456, 457. The arm parts 456a, 457a are arranged at the coupling arm 454 side of the weight parts 456b, 457b, and couple the weight parts 456b, 457b and the coupling arm 454 to each other, respectively.

The pair of drive arms 458, 459 as the vibrating arms respectively have arm parts 458a, 459a, and weight parts 458b, 459b. The weight parts 458b, 459b are respectively arranged in the tip portions at the opposite side to the coupling arm 455 in the drive arms 458, 459. The arm parts 458a, 459a are arranged at the coupling arm 455 side of the weight parts 458b, 459b, and couple the weight parts 458b, 459b and the coupling arm 455 to each other, respectively.

The weight parts 456b, 457b, 458b, 459b, 452b, and 453b arranged in the respective tip portions of the drive arms 456, 457, 458, and 459, and the detection arms 452, 453 each have substantially the same configuration as in Embodiment 1 described above.

Specifically, the metal films 46 are arranged on the second surfaces 102, the first side surfaces 111, the second side surfaces 112, and the third side surfaces 113 in each of the weight parts 456b, 457b, 458b, 459b, 452b, 453b. The metal films 46 arranged on the second surfaces 102 correspond to the first weights 461. The removal area 462 in the second surface 102 is an area which is irradiated with the laser beam LB, and from which the first weight 461 is removed in the frequency adjustment process described above.

Further, when viewed from the Z direction, the first weight 461 in each of the weight parts 456b, 457b, 458b, 459b, 452b, and 453b is disposed so that the outer edge part 463A at the first side surface 111 side in the first weight 461 becomes the same in position as the innermost parts 131 in the first side surface part and the second side surface part of the first side surface 111. Further, the first weight 461 is arranged so that the outer edge part 463B at the second side surface 112 side in the first weight 461 becomes the same in position as the innermost parts 132 in the first side surface part and the second side surface part of the second side surface 112 when viewed from the Z direction. Further, the first weight 461 is arranged so that the outer edge part 463C at the third side surface 113 side in the first weight 461 becomes at the inner side of the innermost parts 133 in the first side surface part and the second side surface part of the third side surface 113 when viewed from the Z direction. Thus, when irradiating the first weight 461 with the laser beam LB, it is possible to prevent the refraction or the blockage of the laser beam LB by the first side surface 111, the second side surface 112, and the third side surface 113 in each of the weight parts 456b, 457b, 458b, 459b, 452b, and 453b. Therefore, it is possible to sufficiently irradiate the first weight 461 with the laser beam LB, and thus occurrence of the foreign particle such as a burr is prevented, and it is possible to provide the vibrator element 1c in which the variation in frequency is difficult to occur.

The electrodes 45 have drive signal electrodes 483, drive ground electrodes 484, first detection signal electrodes 485, first detection ground electrodes 486, second detection signal electrodes 487, and second detection ground electrodes 488.

The drive signal electrodes 483 are arranged on the first surface 101 and the second surface 102 in the arm part 456a of the drive arm 456, the first surface 101 and the second surface 102 in the arm part 457a of the drive arm 457, the first side surface 111 and the second side surface 112 in the arm part 458a of the drive arm 458, and the first side surface 111 and the second side surface 112 in the arm part 459a of the drive arm 459.

The drive ground electrodes 484 are arranged on the first side surface 111 and the second side surface 112 in the arm part 456a of the drive arm 456, the first side surface 111 and the second side surface 112 in the arm part 457a of the drive arm 457, the first surface 101 and the second surface 102 in the arm part 458a of the drive arm 458, and the first surface 101 and the second surface 102 in the arm part 459a of the drive arm 459.

The first detection signal electrodes 485 are arranged on the first surface 101 and the second surface 102 in the arm part 452a of the detection arm 452, and the first detection ground electrodes 486 are arranged on the first side surface 111 and the second side surface 112 in the arm part 452a of the detection arm 452.

The second detection signal electrodes 487 are arranged on the first surface 101 and the second surface 102 in the arm part 453a of the detection arm 453, and the second detection ground electrodes 488 are arranged on the first side surface 111 and the second side surface 112 in the arm part 453a of the detection arm 453.

Such a vibrator element 1c detects the angular velocity ωz in the following manner.

Figure 24:
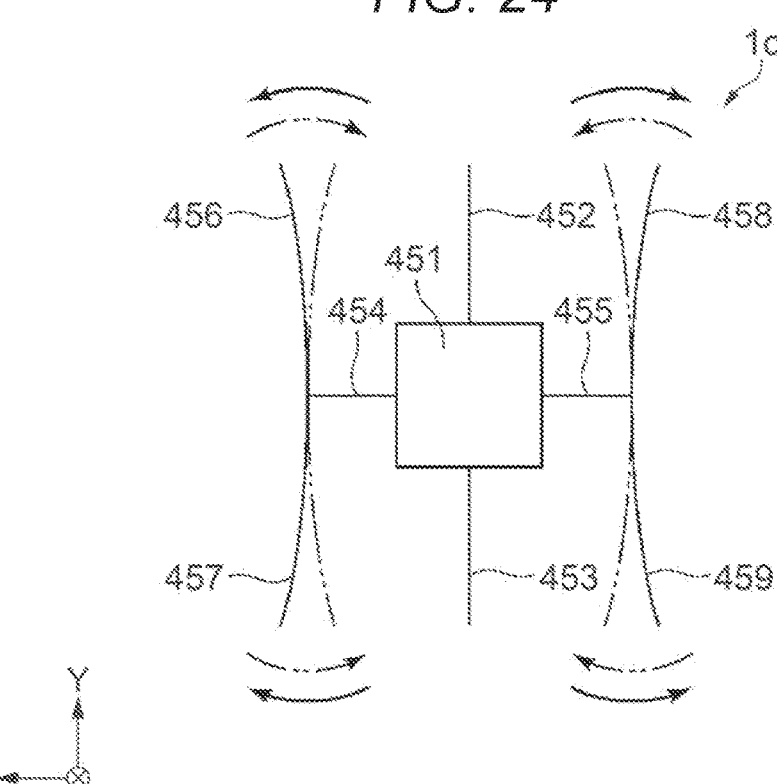
FIG. 24 is a schematic diagram for explaining an action of the vibrator element according to Embodiment 5.

As shown in FIG. 24, first, when applying the drive signal between the drive signal electrodes 483 and the drive ground electrodes 484, the drive arms 456, 457, 458, and 459 flexurally vibrate as represented by arrows shown in FIG. 24. This drive mode is hereinafter referred to as a drive vibration mode.

Figure 25:
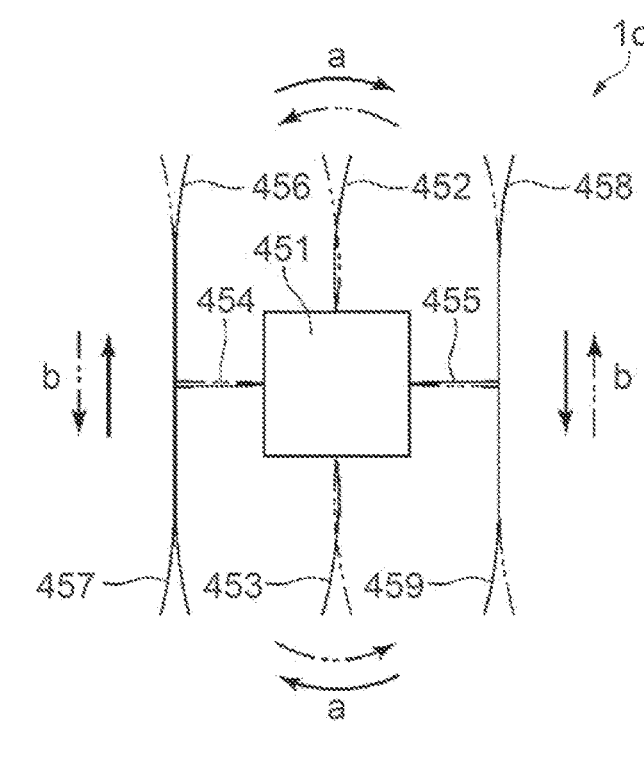
FIG. 25 is a schematic diagram for explaining an action of the vibrator element according to Embodiment 5.

Further, as shown in FIG. 25, when the angular velocity ωz is applied to the vibrator element 1c in the state in which the vibrator element 1c is driven in the drive vibration mode, a detection vibration mode is newly excited. In the detection vibration mode, a Coriolis force acts on the drive arms 456, 457, 458, and 459, and the vibration in the direction represented by arrows b in FIG. 25 is excited. Then, in concert with the vibrations in a direction represented by the arrows b in the drive arms 456, 457, 458, and 459, the detection vibration due to the flexural vibration in a direction represented by arrows a occurs in the detection arms 452, 453. It is possible to extract a charge generated in the detection arm 452 due to such a detection vibration mode between the first detection signal electrodes 485 and the first detection ground electrodes 486 as a first detection signal, extract a charge generated in the detection arm 453 between the second detection signal electrodes 487 and the second detection ground electrodes 488 as a second detection signal, and then detect the angular velocity ωz based on these first and second detection signals.

According also to such Embodiment 5 as described hereinabove, substantially the same advantages as in Embodiment 1 described above can be obtained. In other words, the vibrator element according to the present disclosure can also be applied to a gyro element.

What is claimed is:

1. A vibrator element comprising:
a base part;
a vibrating arm which includes a first surface, a second surface at an opposite side to the first surface in a direction along a Z axis, a first side surface, a second side surface at an opposite side to the first side surface in a direction along an X axis perpendicular to the Z axis, and a third side surface located at an opposite side to the base part, and extends from the base part in a direction along a Y axis perpendicular to the Z axis and the X axis; and
a first weight arranged on the second surface, wherein
each of the first side surface, and the second side surface is configured by a first side surface part and a second side surface part that is directly contiguous with the first side surface part, and the first side surface part is tilted with respect to a direction along the Z axis, and the second side surface part is tilted toward the first surface or the second surface with respect to the first side surface part,
the first side surface part of the first side surface and the first side surface part of the second side surface are directly contiguous with the second surface, and
when viewed from a direction along the Z axis, the first weight is arranged such that an outer edge portion on the first side surface side is substantially aligned with the innermost portions of the first side surface part and the second side surface part of the first side surface, and an outer edge portion on the second side surface side is substantially aligned with the innermost portions of the first side surface part and the second side surface part of the second side surface.

2. The vibrator element according to claim 1, wherein the third side surface has the first side surface part and the second side surface part, and
when viewed from a direction along the Z axis, the first weight is arranged so that an outer edge portion on the third side surface side is closer to the base part than the innermost portions in the first side surface part and the second side surface part of the third side surface.

3. The vibrator element according to claim 1, wherein the vibrating arm has a weight part provided with the first weight and an arm part which is located at the base part side of the weight part, and the first surface and the second surface of the arm part are provided with a recessed part, and
a width in a direction along the X axis in the second surface of the weight part is smaller than a width in a direction along the X axis in the first surface of the weight part.

4. The vibrator element according to claim 3, wherein a width in a direction along the X axis in the first surface of the arm part is equal to a width in a direction along the X axis in the second surface of the arm part.

5. The vibrator element according to claim 1, further comprising:
a second weight arranged on the first side surface part.

6. A vibrator device comprising:
the vibrator element according to claim 1; and
a package configured to house the vibrator element.

7. A method of manufacturing a vibrator element, comprising:
a frequency adjustment method of adjusting a frequency of the vibrator element, wherein
the vibrator element includes
a base part,
a vibrating arm which includes a first surface, a second surface at an opposite side to the first surface in a direction along a Z axis, a first side surface, a second side surface at an opposite side to the first side surface in a direction along an X axis perpendicular to the Z direction, and a third side surface located at an opposite side to the base part, and extends from the base part in a direction along a Y axis perpendicular to the Z axis and the X axis, and
a first weight arranged on the second surface,
each of the first side surface and the second side surface is configured by a first side surface part and a second side surface part that is directly contiguous with the first side surface part, and the first side surface part is tilted with respect to a direction along the Z axis, and the second side surface part is tilted toward the first surface or the second surface with respect to the first side surface part,
the first side surface part of the first side surface and the first side surface part of the second side surface are directly contiguous with the second surface,
when viewed from a direction along the Z axis the first weight is arranged such that an outer edge portion on the first side surface side is substantially aligned with the innermost portions of the first side surface part and the second side surface part of the first side surface, and an outer edge portion on the second side surface side is substantially aligned with the innermost portions of the first side surface part and the second side surface part of the second side surface, and
the frequency adjustment method includes irradiating at least a part of the first weight with a laser beam from the first surface side in a direction along the Z axis to remove the at least a part of the first weight to thereby change an oscillation frequency of the vibrator element.

8. The method of manufacturing the vibrator element according to claim 7, wherein
the vibrating arm is provided with a second weight arranged on the first side surface part, and
the frequency adjustment method includes irradiating at least a part of the second weight with a laser beam from the first surface side in a direction along the Z axis to remove the at least a part of the second weight to thereby change the oscillation frequency of the vibrator element.

9. The method of manufacturing the vibrator element according to claim 7, wherein the third side surface has the first side surface part and the second side surface part, and when viewed from a direction along the Z axis, the first weight is arranged so that an outer edge portion on the third side surface side is closer to the base part than the innermost portions in the first side surface part and the second side surface part of the third side surface.

\* \* \* \* \*